(12) United States Patent
Odagawa et al.

(10) Patent No.: US 7,446,391 B2
(45) Date of Patent: Nov. 4, 2008

(54) ELECTRO-RESISTANCE ELEMENT AND METHOD OF MANUFACTURING THE SAME

(75) Inventors: Akihiro Odagawa, Osaka (JP); Yasunari Sugita, Osaka (JP); Tsutomu Kanno, Osaka (JP); Akihiro Sakai, Osaka (JP); Hideaki Adachi, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 295 days.

(21) Appl. No.: 11/326,520

(22) Filed: Jan. 6, 2006

(65) Prior Publication Data
US 2006/0120205 A1  Jun. 8, 2006

Related U.S. Application Data

(63) Continuation of application No. PCT/JP2005/016396, filed on Sep. 7, 2005.

(30) Foreign Application Priority Data

Sep. 9, 2004  (JP)  ............................. 2004-261920

(51) Int. Cl.
*H01L 21/20* (2006.01)
(52) U.S. Cl. ...................... 257/536; 438/396
(58) Field of Classification Search ............... 257/528, 257/533, 536, 537; 438/329, 330, 382, 396, 438/171, 190, 210, 230, 238
See application file for complete search history.

(56) References Cited

U.S. PATENT DOCUMENTS 6,087,674 A    7/2000  Ovshinsky et al.
6,204,139 B1   3/2001  Liu et al.
6,815,744 B1 * 11/2004 Beck et al. ............ 257/295
2003/0062553 A1 * 4/2003 Ramesh et al. ......... 257/295

(Continued)

FOREIGN PATENT DOCUMENTS

JP    2002-512439 A    4/2002

(Continued)

OTHER PUBLICATIONS

J.E. Christopher, et al., "Experiments with Tunnel Junctions Using Ferromagnetic Metals," Physical Review, Aug. 10, 1968, pp. 485-498, vol. 172, No. 2.

(Continued)

*Primary Examiner*—S. V Clark
(74) *Attorney, Agent, or Firm*—McDermott Will & Emery LLP

(57) ABSTRACT

An electro-resistance element that has a different configuration from conventional elements and shows outstanding resistance change characteristics is provided. An electro-resistance element has two or more states in which electric resistance values are different, and is switchable from one of the two or more states into another by application of a predetermined voltage or current. The electro-resistance element includes: a multilayer structure including an upper electrode, a lower electrode, and an electro-resistance layer sandwiched by the electrodes, the multilayer structure disposed on a substrate; wherein the electro-resistance layer has a spinel structure, and a surface of the lower electrode that faces the electro-resistance layer is oxidized. The electro-resistance element can be manufactured by a manufacturing process at 400° C. or lower.

9 Claims, 21 Drawing Sheets

U.S. PATENT DOCUMENTS

2004/0232893 A1 11/2004 Odagawa et al.
2006/0158095 A1* 7/2006 Imamura .................... 313/500

FOREIGN PATENT DOCUMENTS

| JP | 2002-280542 A | 9/2002 |
| JP | 2002-537627 A | 11/2002 |
| WO | WO 2004/068604 A1 | 8/2004 |

OTHER PUBLICATIONS

R.C. Morris, et al., "Conduction Phenomena in Thin Layers of Iron Oxide," Physical Review, Aug. 10, 1969, vol. 184, No. 2, pp. 565-573.

* cited by examiner

ELECTRO-RESISTANCE ELEMENT AND METHOD OF MANUFACTURING THE SAME

RELATED APPLICATIONS

This Application is a continuation of International Application No. PCT/JP2005/016396, whose international filing date is Sep. 7, 2005, which in turn claims the benefit of Japanese Patent Application No. 2004-261920, filed on Sep. 9, 2004, the disclosures of which Applications are incorporated by reference herein.

BACKGROUND OF THE INVENTION

1. Field of the Invention

The present invention relates to an electro-resistance element the resistance value of which changes by application of voltage or current, and to a method of manufacturing the same.

2. Related Background Art

Memory elements are used in a wide variety of fields as essential electronic components that are important to support today's information-driven society. In recent years, as portable information terminals have become increasingly popular, demands for miniaturization of memory elements have been increading, and non-volatile memory elements are no exception. However, as the scale of device miniaturization is approaching the nanometer range, a decrease in charge capacity C per information unit (bit) has become a problem with conventional charge storage type memory elements, typically DRAMs: Dynamic Random Access Memories. Although various improvements have been attempted to obviate this problem, there is a concern over the future technological limit.

As a memory element that is less prone to the adverse effects originating from miniaturization, a non-volatile memory element that records information by changes in electric resistance R, not by changes in charge capacity C, has attracted attention. As this kind of memory element, JP 2002-512439A discloses an element using a chalcogen compound (TeGeSb); U.S. Pat. No. 6,204,139 discloses an element using a perovskite oxide ($Pr_{0.7}Ca_{0.3}MnO_3$: PCMO); and JP 2002-537627A discloses an element using various oxides including a perovskite oxide (see, for example, paragraph [0025]).

The element disclosed in JP 2002-512439A, however, utilizes a resistance change associated with a crystalline-amorphous phase change of the above-mentioned chalcogen compound, the element is also referred to as a phase change memory element, and the phase change of the chalcogen compound is controlled by applying heat to the element. In the phase change element, problems remain in miniaturization and response speed of the element.

The element disclosed in U.S. Pat. No. 6,204,139 has problems of stability in operation and reproducibility in characteristics. In addition, in order to construct a memory cell array with the use of the element, the element needs to be used in combination with a semiconductor element (a transistor, a diode, or the like) for selecting the element when recording and reading information, but crystallization of perovskite oxide such as PCMO generally requires a high temperature of from 650° C. to 850° C., leading to the problem of affinity with semiconductor manufacturing processes. In particular, in order to achieve high integration in memories associated with element miniaturization, it is desired that the manufacturing process temperature for the element be set lower than the just-noted temperature range.

JP 2002-537627A discloses an element employing various oxides including a perovskite oxide.

In addition to these prior examples, JP 2002-280542A may be mentioned as a prior example related to the present invention.

It is an object of the present invention to provide an electro-resistance element that has a different configuration from those of the conventional elements and is excellent in its resistance change characteristics. It is another object of the present invention to provide a method of manufacturing the element.

SUMMARY OF THE INVENTION

The present invention provides an electro-resistance element having two or more states in which electric resistance values are different, and being switchable from one of the two or more states into another by application of a predetermined voltage or current, the electro-resistance element including: a multilayer structure including an upper electrode, a lower electrode, and an electro-resistance layer sandwiched by the electrodes, the multilayer structure disposed on a substrate; wherein the electro-resistance layer has a spinel structure, and a surface of the lower electrode that faces the electro-resistance layer is oxidized.

In the electro-resistance element of the present invention, it is preferable that an oxide film of the element that constitutes the lower electrode be formed in the surface of the lower electrode.

In the electro-resistance element of the present invention, it is preferable that the lower electrode contain at least one element selected from the group consisting of Ru (ruthenium), Ti (titanium), Al (aluminum), Ta (tantalum), Cu (copper), W (tungsten) and Ni (nickel).

In the electro-resistance element of the present invention, it is preferable that the electro-resistance layer contain an oxide having a composition represented by the formula $MM'_2O_4$, where M and M' are at least one element selected from the group consisting of Mn (manganese), Fe (iron), Co (cobalt), Ni (nickel), Cu (copper), and Zn (zinc), and may be either different from each other or the same.

In the electro-resistance element of the present invention, M' is preferably Fe.

In the electro-resistance element of the present invention, the resistance change rate may be made 400% or greater, or 850% or greater, by selecting the configuration of the element.

The predetermined voltage or current applied to the electro-resistance element of the present invention is preferably in a pulse form.

The present invention also provides a method of manufacturing the electro-resistance element according to the present invention, including: forming a lower electrode on a substrate; oxidizing a surface of the formed lower electrode; and forming, on the oxidized lower electrode, an electro-resistance layer having a spinel structure, and an upper electrode in that order.

In the manufacturing method according to the present invention, it is preferable that the forming of the lower electrode and the forming of the electro-resistance layer and the upper electrode be performed while the temperature of the substrate is set at 400° C. or lower.

DETAILED DESCRIPTION OF THE INVENTION

Figure 1:
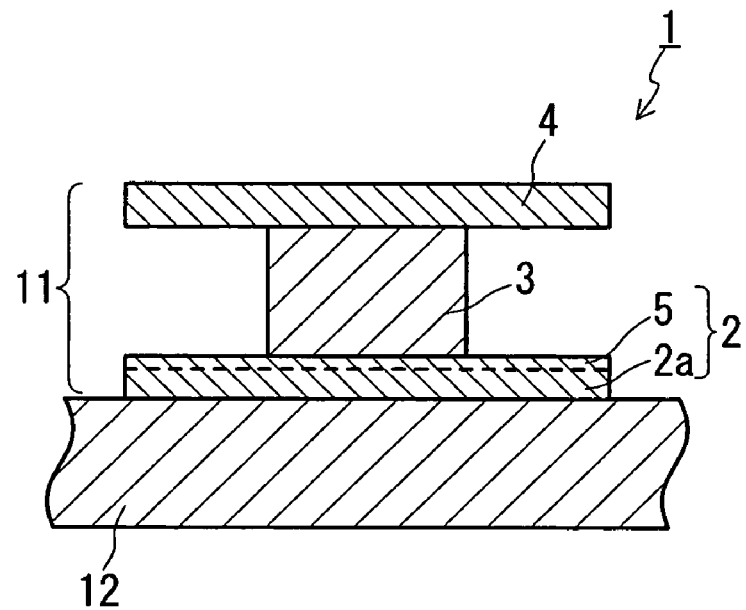
FIG. 1 is a cross-sectional view schematically illustrating one example of an electro-resistance element according to the present invention.

Hereinbelow, preferred embodiments of the present invention are described with reference to the drawings. In the following description, same components are denoted by same reference numerals, and further elaboration thereof may be omitted.

An electro-resistance element of the present invention will be described.

An electro-resistance element 1 shown in FIG. 1 includes a substrate 12, a pair of electrodes comprised of a lower electrode 2 and an upper electrode 4, an electro-resistance layer 3 sandwiched by the lower electrode 2 and the upper electrode 4. The lower electrode 2, the electro-resistance layer 3, and the upper electrode 4 are disposed on the substrate 12 in that order, forming a multilayer structure (stacked structure) 11. The electro-resistance layer 3 has a spinel structure. The surface of the lower electrode 2 that faces the electro-resistance layer 3 is oxidized.

The electro-resistance element 1 has two or more states in which electric resistance values are different from each other, and the element 1 may be switched from one state selected from the two or more states into another by applying a predetermined voltage or current to the element 1. In the case where the element 1 has two states in which electric resistance values are different (one of the states in which the resistance is relatively high is defined as "state A," while the other in which the resistance is relatively low is defined as "state B"), the element 1 is switched from state A into state B, or from state B to state A, by application of a predetermined voltage or current.

Such an electro-resistance element shows good resistance change characteristics. The resistance change rate of the electro-resistance element according to the present invention is generally 400% or greater, and may be made 850% or greater by, for example, selecting the material used for the lower electrode 2 or the oxide contained in the electro-resistance layer 3. It should be noted that the resistance change rate refers to a numerical value that serves as an index of the resistance change characteristics of an element; specifically, it is a value obtained by the expression $(R_{MAX}-R_{MIN})/R_{MIN} \times 100$ (%), wherein $R_{MAX}$ denotes the maximum electric resistance value and $R_{MIN}$ denotes the minimum electric resistance value that the element shows.

The electro-resistance element of the present invention can be fabricated through a manufacturing process at 400° C. or lower and thus has outstanding affinity with semiconductor manufacture processes. For this reason, the electro-resistance element of the present invention can be easily applied to various devices (for example, to an electro-resistance memory) by combining it with semiconductor elements, and by the combinations, it is possible to obtain electronic devices that achieves good characteristics (for example, resistance change characteristics) and productivity. In addition, the fact that the fabrication is possible at a lower process temperature in comparison with an element employing a perovskite oxide such as PCMO is advantageous in achieving miniaturization of the element as well as higher integration and increased performance in electronic devices, which are associated with the miniaturization of the element.

The configuration of the electro-resistance layer 3 is not particularly limited as long as its crystal structure is a spinel structure. The spinel structure is a structure seen in an oxide having the composition represented by the formula $MM'_2O_4$, in which tetrahedrons of oxygen (O) each having M' at the center and octahedrons of oxygen each having M at the center are aligned periodically. It is preferable that in the element 1, M and M' be at least one element selected from the group consisting of Mn (manganese), Fe (iron), Co (cobalt), Ni (nickel), Cu (copper), and Zn (zinc). This enables the electro-resistance element 1 to exhibit more favorable resistance change rates. In the foregoing, M and M' may be either different from each other or the same.

In particular, it is preferable that M' be Fe. In other words, the electro-resistance layer 3 preferably contains an oxide having the composition represented by the formula $MFe_2O_4$, and M is preferably at least one element selected from the group consisting of Mn, Fe, Co, Ni, Cu, and Zn. This allows the electro-resistance element 1 to have a more favorable resistance change rate, and moreover, Fe is also advantageous in that it is lower in cost than the rest of the elements M' (Mn, Co, Ni, Cu, and Zn) and that the load to the environment is less.

The thickness of the electro-resistance layer 3 is generally in the range of from 1 nm to 1000 nm.

The lower electrode 2 is adequate as long as it has electrical conductivity and the surface thereof that faces the electro-resistance layer 3 is oxidized. For example, an oxide film (a film 5 shown in FIG. 1) of the element that constitutes the lower electrode 2 may be formed in the just-noted surface of the lower electrode 2, and the electro-resistance layer 3 may be arranged on the film 5. The boundary between the film 5 portion of the lower electrode 2 and the portion other than the film 5 (a lower-electrode main portion 2*a*) need not necessarily be clear.

The lower electrode 2 is representatively made of metal, and specifically, it is preferable that the lower electrode 2 contain at least one element selected from the group consisting of Ru (ruthenium), Ti (titanium), Al (aluminum), Ta (tantalum), Cu (copper), W (tungsten), and Ni (nickel). When the lower electrode 2 is made of the at least one element, the film 5 is an oxide film of the at least one element.

It is preferable that the lower electrode 2 be made of a material capable of growing the electro-resistance layer 3 on a surface thereof by crystallization growth. In this case, the electro-resistance layer 3 that has a stable crystal structure can be formed on the lower electrode 2, and the electro-resistance layer 3 can be more easily formed on the lower electrode 2; thus, it is possible to construct the electro-resistance element 1 that achieves good productivity and shows stable resistance change characteristics.

The upper electrode 4 is basically adequate as long as it has electrical conductivity, and may be made of, for example, Au (gold), Pt (platinum), Ru (ruthenium), Ir (iridium), Ti (titanium), Al (aluminum), Cu (copper), Ta (tantalum), alloys thereof (for example, iridium-tantalum alloy (Ir-Ta)), oxides thereof (for example, indium-tin oxide (ITO)), nitrides thereof, fluorides thereof, carbonates thereof, or borides thereof.

The substrate 12 may be, for example, a silicon substrate, and in this case, the electro-resistance element of the present invention can be easily combined with a semiconductor element. The surface of the substrate 12 that is in contact with the lower electrode 2 may be oxidized (an oxide film may be formed on a surface of the substrate 12).

Figure 2:
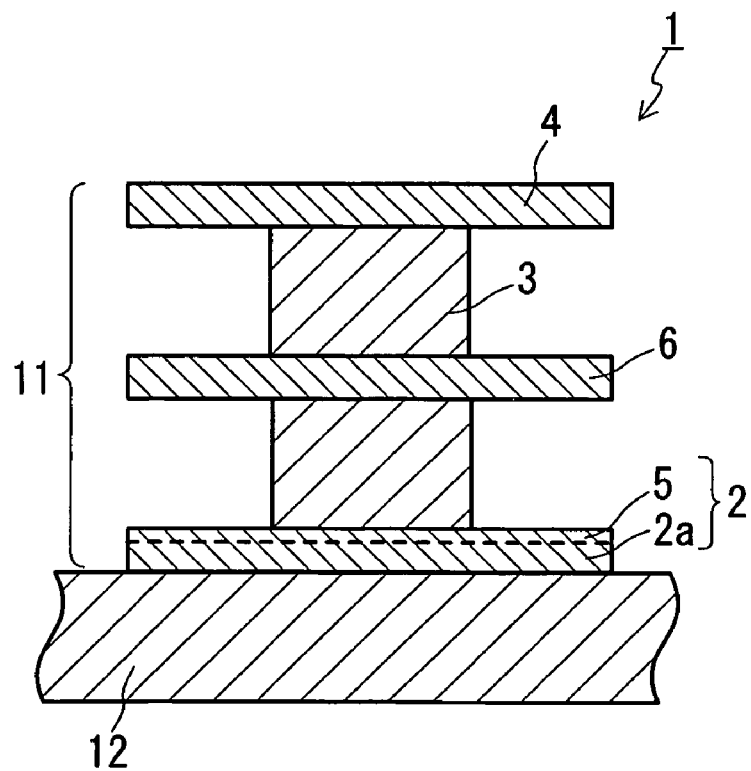
FIG. 2 is a cross-sectional view schematically illustrating another example of the electro-resistance element according to the present invention.

The configuration of the electro-resistance element of the present invention is not particularly limited as long as the multilayer structure 11 including the lower electrode 2, the electro-resistance layer 3, and the upper electrode 4 is formed on the substrate 12, and the electro-resistance layer 3 is sandwiched by the lower electrode 2 and the upper electrode 4. For example, as illustrated in FIG. 2, a pair of electro-resistance layers 3*a* and 3*b* that sandwich an intermediate electrode 6 may be arranged between the lower electrode 2 and the upper electrode 4. In this case, the electro-resistance element 1 may have at least three states each having a different electric resistance value by applying a predetermined voltage or current between the lower electrode 2 and the intermediate electrode 6, between the upper electrode 4 and the intermediate electrode 6, and/or between the lower electrode 2 and the upper electrode 4. In other words, the electro-resistance element 1 can achieve multi-level states. It should be noted that in the element 1 shown in FIG. 2, the surface of the intermediate electrode 6 that faces the electro-resistance layer 3*a* (the upper electrode 2) is oxidized.

The predetermined voltage or current may be applied to the electro-resistance element 1 via the lower electrode 2 and the upper electrode 4. By application of the predetermined voltage or current, the state of the element 1 change, for example, from the state A to the state B. The state after the change (for example, the state B) is retained until a predetermined voltage or current is applied to the element 1 again, and that state is changed again, for example, from the state B to the state A by application of the foregoing voltage or current. It should be noted that the predetermined voltage or current to be applied to the element 1 need not necessarily be the same between when the element 1 is in the state A and when it is in the state B, and that the magnitude, polarity, flowing direction, and so forth may vary depending on the state of the element 1. That is, in the present specification, it is sufficient that "a predetermined voltage or current" is such a "voltage or current" that the element 1 that is in a certain state can be changed into another state that is different from that certain state.

Thus, the electro-resistance element 1 can hold its electric resistance value until a predetermined voltage or current is applied to the element 1. Therefore, by combining the element 1 and a mechanism for detecting the foregoing states in the element 1 (that is, a mechanism for detecting the electric resistance value of the element 1) and assigning a bit to each of the foregoing states (for example, the state A is assigned to "0" and the state B is assigned to "1"), it is possible to construct a non-volatile electro-resistance memory (a memory element or a memory array in which two or more memory elements are aligned). In addition, it is also possible to apply the element 1 to a switching element by assigning ON or OFF to the above-noted states.

It is preferable that the voltage or current to be applied to the electro-resistance element 1 be in a pulse form. It becomes possible to reduce power consumption and improve switching efficiency in the electronic device when constructing an electronic device, such as a memory, with the use of the element 1. The shape of the pulse is not particularly limited and may be at least one shape selected from, for example, a sine waveform, a rectangular waveform, and a triangular waveform. The pulse width may generally be in the range of from several nanoseconds to several milliseconds.

In order to further reduce power consumption in electronic devices, it is preferable that the shape of the pulse be in a triangular waveform. In order to make the response of the element 1 faster, it is preferable that the pulse shape be a rectangular waveform, which can achieve a response at from about several nanoseconds to about several microseconds. In order to achieve both reduction in power consumption and faster response speed in the element 1, it is preferable that the pulse shape is in a sine waveform. The sine waveform pulse is suitable when the response speed of the element 1 is set at from about several hundred nanoseconds to several hundred microseconds, while the triangular waveform pulse is suitable when the response speed of the element 1 is set at from about several ten microseconds to several milliseconds.

It is preferable that voltage be applied to the electro-resistance element 1, in which case it becomes easier to achieve miniaturization of the element 1 and size reduction of the electronic device constructed with the use of the element 1. In the case of the electro-resistance element 1 having the foregoing two states, the state A and the state B, a potential difference-applying device for creating a potential difference between the lower electrode 2 and the upper electrode 4 may be connected to the element 1. For example, the state of the element 1 may be changed from the state A to the state B by applying a bias voltage such that the potential of the upper electrode 4 becomes positive with respect to the potential of the lower electrode 2 (positive bias voltage) to the element 1, while the state of the element 1 may be changed from the state B to the state A by applying a bias voltage such that the potential of the upper electrode 4 becomes negative with respect to the potential of the lower electrode 2 (negative bias voltage) to the element 1. In other words, by applying a voltage the polarity of which is reversed from the polarity at the time when changing from the state A to the state B, the state of element 1 may be changed from the state B to the state A.

Figure 3:
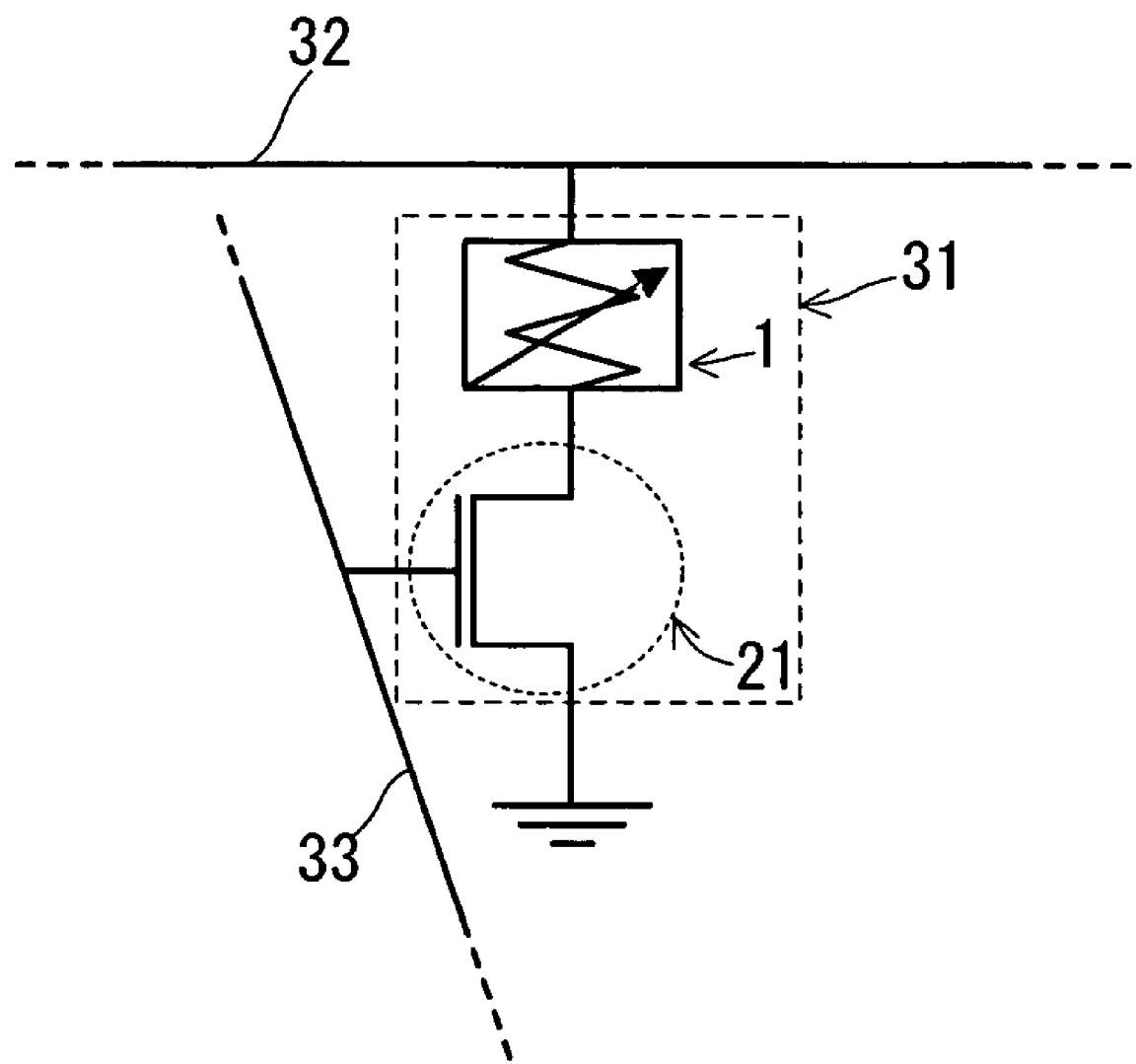
FIG. 3 is a schematic view illustrating one example of an electro-resistance memory provided with the electro-resistance element according to the present invention.

FIG. 3 illustrates one example of an electro-resistance memory (element) in which the electro-resistance element of the present invention and a transistor (MOS field effect transistor (MOS-FET)), which is one type of the semiconductor element, are combined.

An electro-resistance memory element 31 shown in FIG. 3 is provided with the electro-resistance element 1 and a transistor 21. The electro-resistance element 1 is electrically connected to the transistor 21 and a bit line 32. The gate electrode of the transistor 21 is electrically connected to a word line 33, and the remaining electrode of the transistor 21 is grounded. Such a memory element 31 enables the detection of the foregoing states in the electro-resistance element 1 (that is, the detection of the electric resistance value of the element 1) and the application of a predetermined voltage or current to the element 1, using the transistor 21 as a switching element. For example, in the case where the element 1 shows two states in which electric resistance values are different, the memory element 31 shown in FIG. 3 may be used as a 1-bit electro-resistance memory element.

Figure 4:
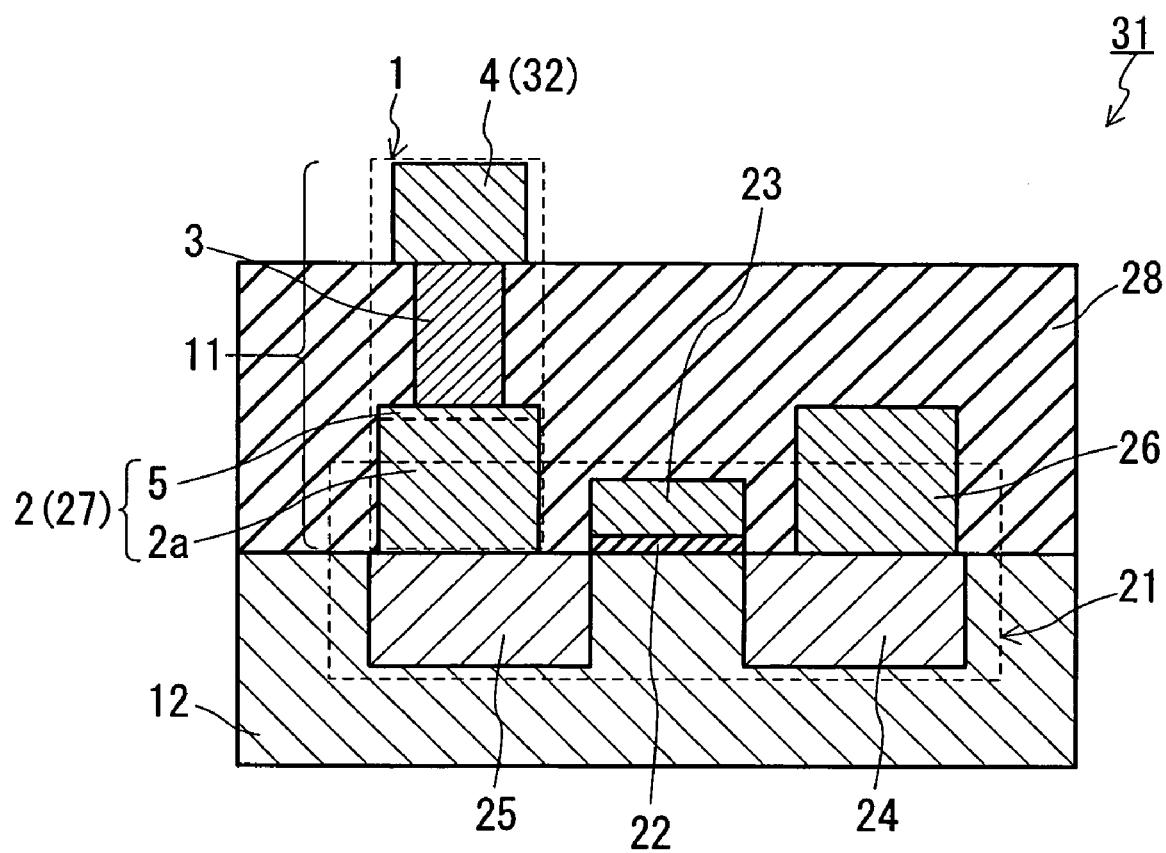
FIG. 4 is a cross-sectional view schematically illustrating one example of an electro-resistance memory provided with the electro-resistance element of the present invention.

FIG. 4 illustrates one example of a specific configuration of an electro-resistance memory (element) provided with an electro-resistance element according to the present invention. In a memory element 31 shown in FIG. 4, the transistor 21 and the electro-resistance element 1 are formed on a silicon substrate (substrate 12), and the transistor 21 and the electro-resistance element 1 are integrated. Specifically, a source 24 and a drain 25 are formed on the substrate 12, and a source electrode 26 is formed on the source 24 while the lower electrode 2 that also serves as a drain electrode 27 formed on the drain 25. A gate electrode 23 is formed on the surface of the substrate 12 and between the source 24 and the drain 25 with a gate insulating film 22 interposed therebetween, and the electro-resistance layer 3 and the upper electrode 4 are disposed on the lower electrode 2 in that order. The gate electrode 23 is electrically connected to a word line (not shown), and the upper electrode 4 also serves as a bit line 32. An interlayer insulating layer 28 is disposed over the substrate 12 so as to cover the surface of the substrate 12, the electrodes, and the electro-resistance layer 3 to prevent electrical leakage between the electrodes.

It is sufficient that the transistor 21 has a common configuration of a MOS-FET.

The interlayer insulating layer 28 may be made of an insulating material such as $SiO_2$ or $Al_2O_3$, or may have a stacked structure of two or more kinds of materials. For the insulating material, a resist material may be used other than $SiO_2$ and $Al_2O_3$. In the case of using a resist material, the interlayer insulating layer 28 can be easily formed by spinner coating or the like, and therefore, an interlayer insulating layer 28 the surface of which is planar can be formed easily even when the interlayer insulating layer 28 is formed on a surface that is not planar.

Although in the example shown in FIG. 4, the electro-resistance memory is constructed by combining an electro-resistance element and a MOS-FET, the configuration of the electro-resistance memory provided with the electro-resistance element of the present invention is not particularly limited, and the electro-resistance element of the present invention may be combined with any semiconductor element, for example, other types of transistors or diodes.

Moreover, although the memory element 31 shown in FIG. 4 has a structure in which the electro-resistance element 1 is disposed directly above the transistor 21, the transistor 21 and the electro-resistance element 1 may be disposed at distant locations from each other, and the lower electrode 2 and the drain electrode 27 may be electrically connected by a extraction electrode. To simplify the manufacturing process of the memory element 31, it is preferable that the electro-resistance element 1 and the transistor 21 be disposed spaced apart from each other; however, when the electro-resistance element 1 is disposed directly above the transistor 21, as shown in FIG. 4, the occupied area by the memory element 31 becomes small and therefore it is possible to realize an electro-resistance memory array having a higher density.

Recording of information into the memory element 31 may be performed by application of a predetermined voltage or current to the electro-resistance element 1, and reading of the information recorded in the element 1 may be performed by varying the magnitude of the voltage or current applied to the element 1 from that in the recording. As the method of recording and reading information, one example of the method in which a pulsed voltage is applied to the element 1 is explained with reference to FIG. 5.

In the example shown in FIG. 5, the electro-resistance element 1 has such resistance change characteristics as follows; the element 1 is turned from a state in which the electric resistance is relatively large (state A) to a state in which the electric resistance is relatively small (state B) by application of a positive bias voltage having a magnitude equal to or greater than a certain threshold value ($V_0$), while the element 1 is turned from the state in which the electric resistance is relatively small (state B) to the state in which the electric resistance is relatively large (state A) by application of a negative bias voltage having a magnitude equal to or greater than a certain threshold value ($V_{0'}$). It is assumed that the positive bias voltage means a voltage such that the potential of the upper electrode 4 with respect to the potential of the lower electrode 2 becomes positive, and the negative bias voltage means a voltage such that the potential of the upper electrode 4 with respect to the lower electrode 2 becomes negative. The magnitude of each bias voltage corresponds to the magnitude of the potential difference between the lower electrode 2 and the upper electrode 4.

It is assumed that the initial state of the electro-resistance element 1 is the state A. When a positive bias voltage $V_S$ ($|V_S| \geq V_0$) in a pulse form is applied between the lower electrode 2 and the upper electrode 4, the element 1 is switched from the state A to the state B (SET in FIG. 5). The positive bias voltage applied at this time is denoted as SET voltage.

Figure 5:
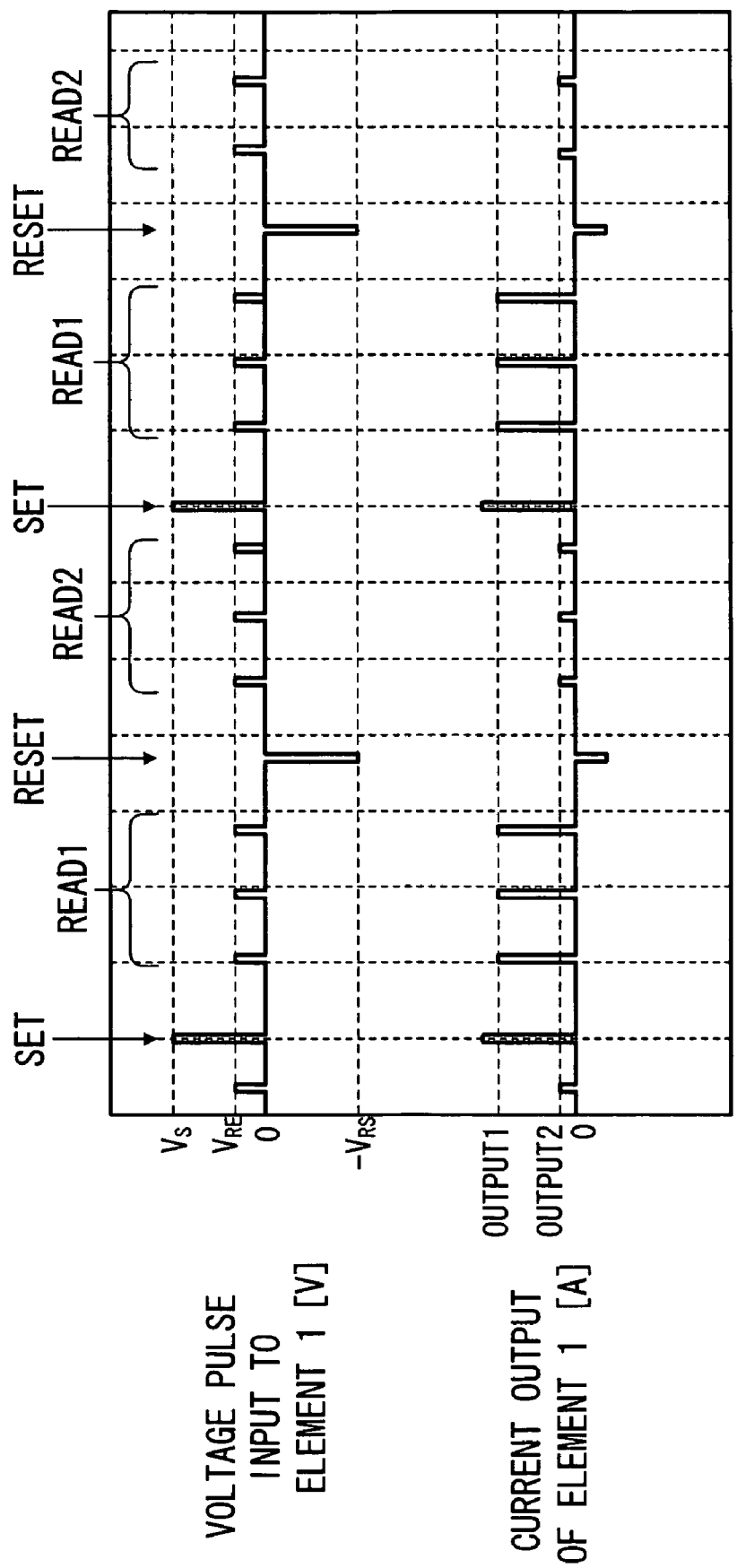
FIG. 5 is a chart for illustrating one example of an information recording and reading method in the electro-resistance memory provided with the electro-resistance element of the present invention.

Here, if a positive bias voltage that is smaller than the SET voltage and whose magnitude is less than $V_0$ is applied to the element 1, the electric resistance value of the element 1 can be detected as a current output of the element 1 (READ1 and OUTPUT1 in FIG. 5). The detection of the electric resistance value can also be done by applying to the element 1 a negative bias voltage the magnitude of which is less than $V_{0'}$. These voltages applied for detecting the electric resistance value of the element 1 are denoted as READ voltage ($V_{RE}$). The READ voltage may be in a pulse form, as shown in FIG. 5, in which case it is possible to reduce the power consumption and improve the switching efficiency in the memory element 31, as in the case where the SET voltage is in a pulse form. Since the application of READ voltage does not change the state of the element 1 (state B), the same electric resistance value can be detected even when READ voltage is applied a plurality of times.

Next, when a negative bias voltage $V_{RS}$ ($|V_{RS}| \geq V_{0'}$) in a pulse form is applied between the lower electrode 2 and the upper electrode 4, the element 1 is switched from the state B to the state A (RESET in FIG. 5). The negative bias voltage applied at this time is denoted as RESET voltage.

Here, if READ voltage is applied to the element 1, the electric resistance value of the element 1 can be detected as the current output of the element 1 (READ2 and OUTPUT2 in FIG. 5). In this case as well, since the application of READ voltage does not change the state of the element 1 (state A), the same electric resistance value can be detected even when READ voltage is applied a plurality of times.

Thus, it is possible to perform recording and reading of information to the memory element 31 by application of voltage in a pulse form, and the magnitude of the output current from the element 1 obtained by the reading varies corresponding to the state of the element 1. Here, assuming that the state in which the output current is relatively large (OUTPUT1 in FIG. 5) is defined as "1" while the state in which the output current is relatively small (OUTPUT2 in FIG. 5) is defined as "0", the memory element 31 can record information "1" by the SET voltage and can record information "0" (can erase information "1") by the RESET voltage.

To apply a voltage in a pulse form to the electro-resistance element 1 in the memory element 31 shown in FIG. 4, the transistor 21 may be brought to an ON state by the word line to apply a voltage through the bit line 32.

It is preferable that the magnitude of READ voltage be generally about ¼ to ¹⁄₁₀₀₀ of the magnitude of SET voltage and RESET voltage. Specific values of the SET voltage and RESET voltage are generally within the range of from 0.1 V to 20 V, preferably within the range of from 1 V to 12 V, although they may depend on the configuration of the electro-resistance element 1.

Figure 6:
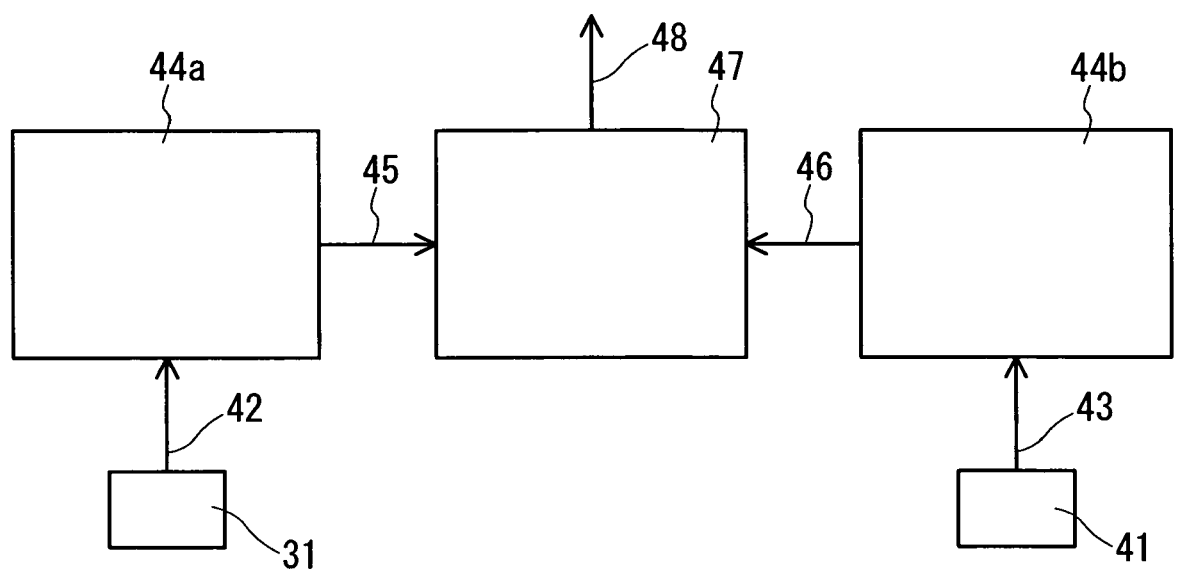
FIG. 6 is a chart for illustrating one example of an information reading method in the electro-resistance memory provided with the electro-resistance element of the present invention.

It is preferable that the detection of the electric resistance value of the element 1 be performed by preparing a reference element separately from the element to be detected, and detecting a difference from a reference resistance value (for example, a reference output current value) that is obtained by applying READ voltage in the same manner as in the foregoing to the reference element. In the method illustrated in FIG. 6, an output signal 48 is detected that is obtained by feeding, into a differential amplification circuit 47, an output 45 obtained by amplifying an output 42 from the memory element 31 by a negative feedback amplification circuit 44a and an output 46 obtained by amplifying an output 43 from a reference element 41 by a negative feedback amplification circuit 44b.

Figure 7:
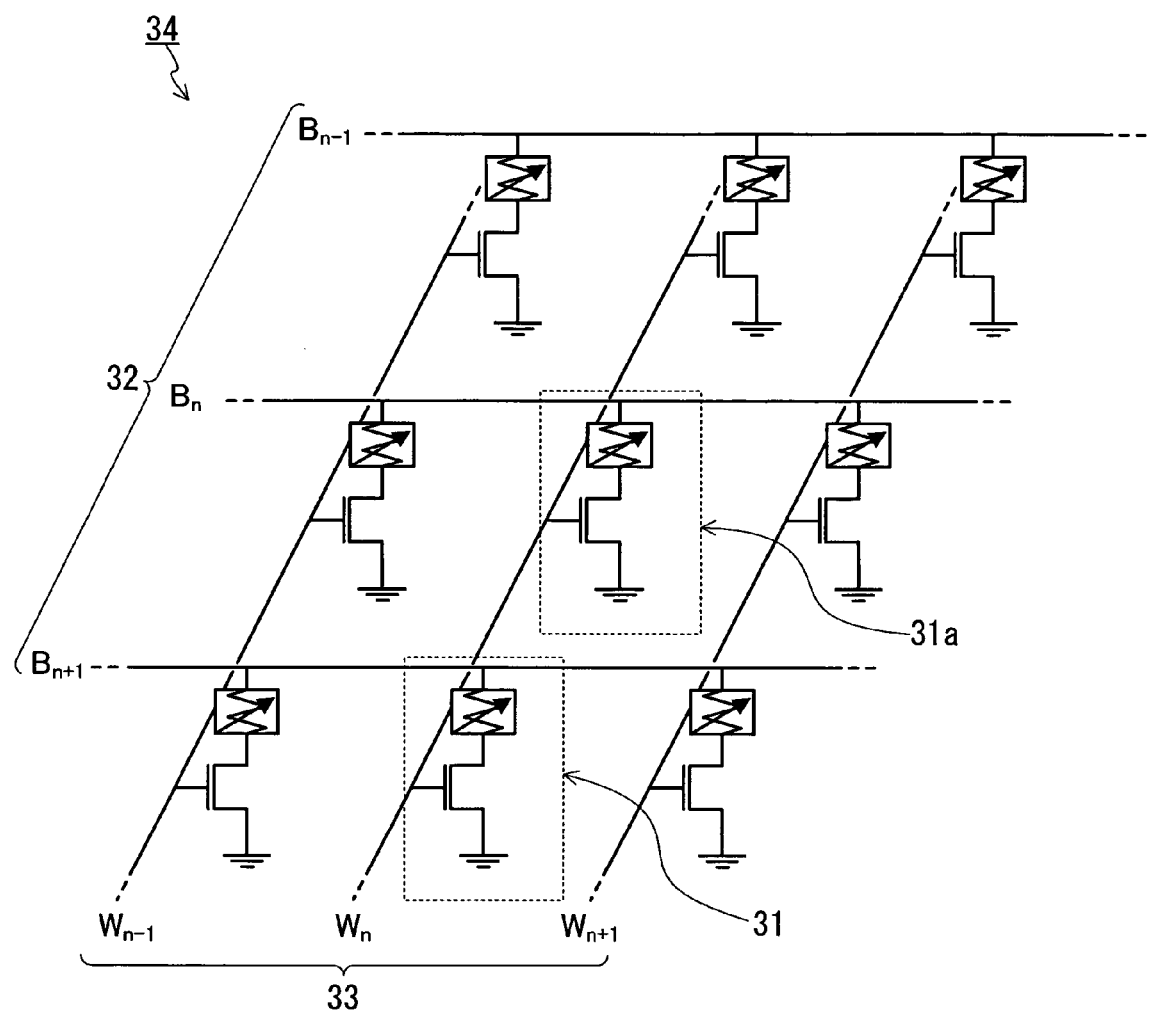
FIG. 7 is a schematic view illustrating one example of an electro-resistance memory (array) provided with the electro-resistance element of the present invention.

When two or more memory elements 31 are aligned in a matrix form as shown in FIG. 7, a non-volatile and random access type electro-resistance memory (array) 34 can be constructed. With the memory array 34, it becomes possible to record information into a memory element 31a, which is located at a coordinate ($B_n$, $W_n$), and to read information from the memory element 31a, by selecting one bit line ($B_n$) selected from two or more bit lines 32 and one word line ($W_n$) selected from two or more word lines 33.

As shown in FIG. 7, when two or more memory elements 31 are aligned in a matrix form, at least one memory element 31 may be used as a reference element.

Figure 8:
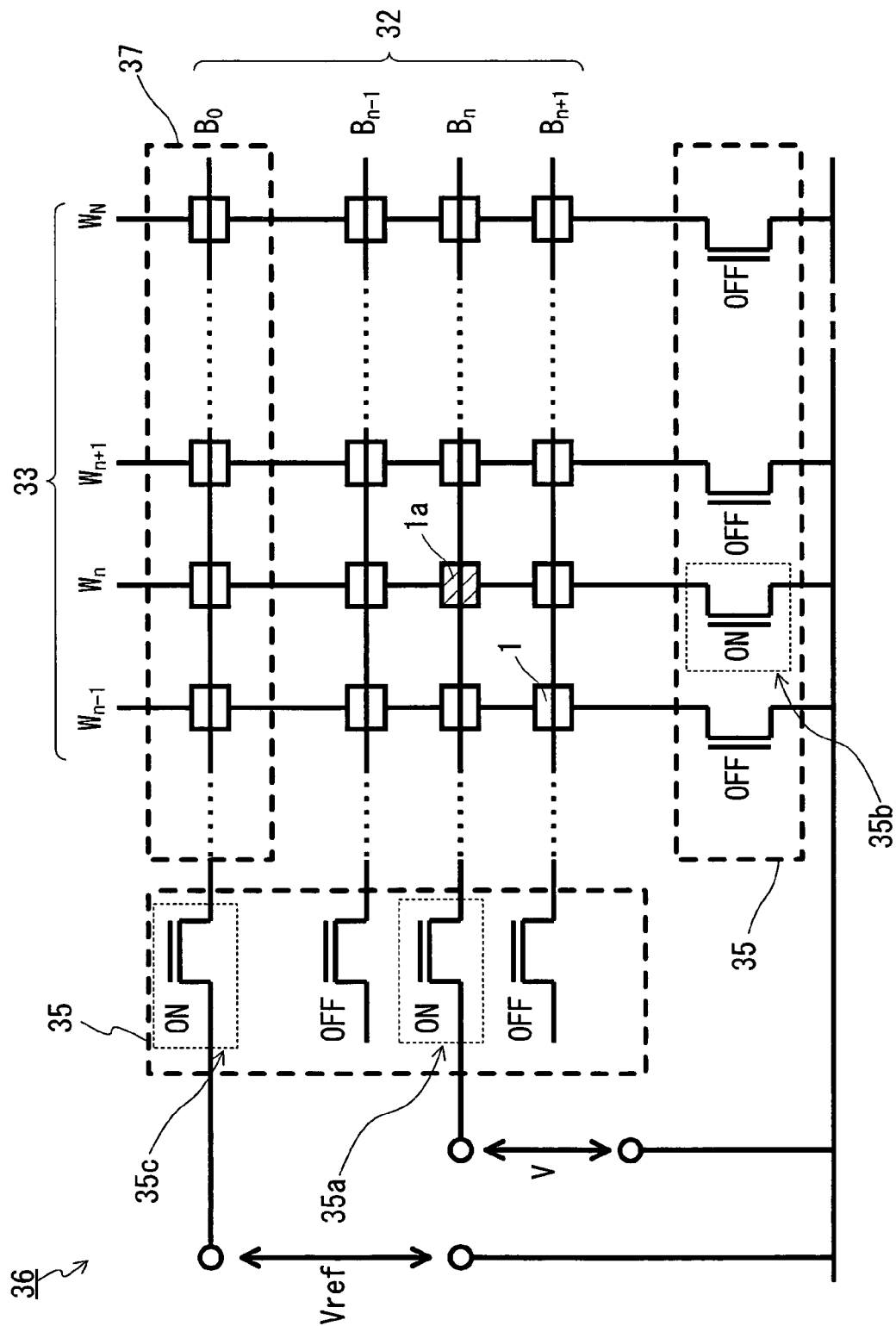
FIG. 8 is a schematic view illustrating another example of an electro-resistance memory (array) provided with the electro-resistance element of the present invention.

As shown in FIG. 8, a non-volatile, random access type electro-resistance memory (array) 36 may be constructed by using pass transistors 35 and aligning two or more electro-resistance elements 1 in a matrix form. In the memory 36, the bit lines 32 are connected to the lower electrodes 2 of the elements 1, and the word lines 33 are connected to the upper electrodes 4 of the elements 1. In the memory 36, a pass transistor 35a that is connected to one bit line ($B_n$) selected from the two or more bit lines 32 and a pass transistor 35b that is connected to one word line ($W_n$) selected from the two or more word lines 33 are selectively brought to an ON state, whereby recording of information into an electro-resistance element 1a located at a coordinate ($B_n$, $W_n$) and reading of information from the electro-resistance element 1a become possible. Information can be read by, for example, measuring the voltage V shown in FIG. 8, which is the voltage corresponding to the electric resistance value of the element 1a. It should be noted that in the example shown in FIG. 8, a reference element group 37 is arranged in the memory 36, and the difference between the output from the element 1a and the output from the reference element group 37 can be detected by selectively bringing a pass transistor 35c corresponding to a bit line ($B_0$) connected to the reference element group 37 into an ON state so as to measure the voltage $V_{REF}$ shown in FIG. 8.

One example of the method of manufacturing the electro-resistance element according to the present invention is shown in FIGS. 9A to 9H, as one example of the method of manufacturing a memory element in which the electro-resistance element of the present invention is incorporated.

Figure 9A:
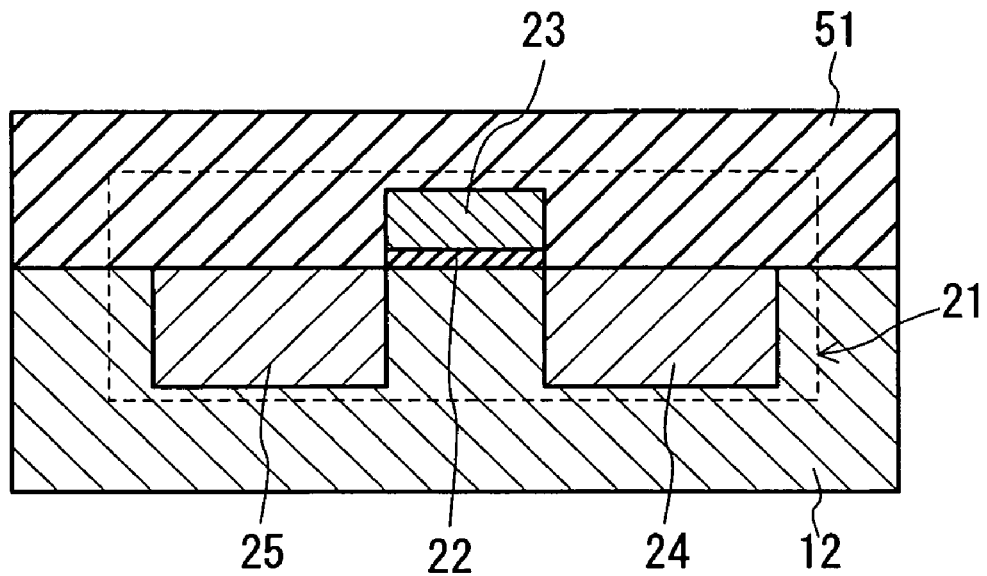
FIGS. 9A to 9H are process drawings schematically illustrating one example of the method of manufacturing an electro-resistance element according to the present invention.
Figure 9B:
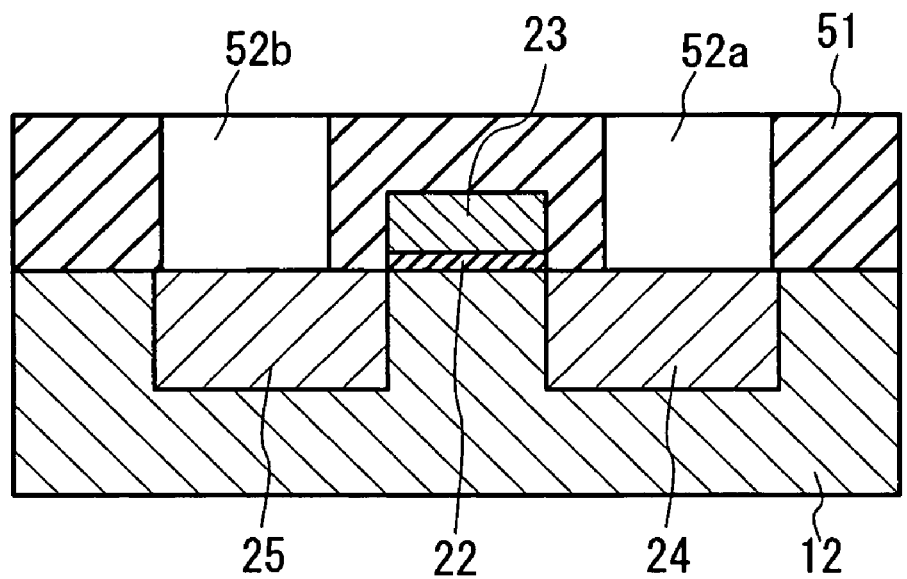

First, a substrate 12 is prepared, on which a transistor 21, a MOS-FET, is formed (FIG. 9A). A source 24, a drain 25, a gate insulating film 22, and a gate electrode 23 are formed on the substrate 12. An insulating oxide film 51 made of an insulating material such as $SiO_2$ is disposed over the substrate 12 so as to entirely cover the surface of the substrate 12, the gate insulating film 23, and the gate electrode 23.

Figure 9C:
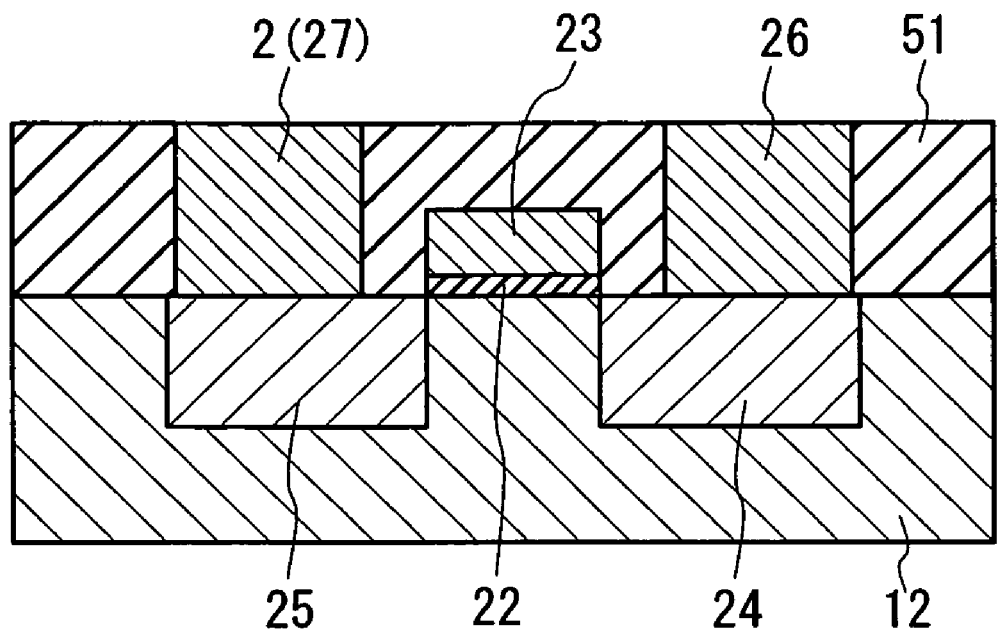

Next, contact holes 52a and 52b that reach the source 24 and the drain 25 in the transistor 21 are formed through the insulating oxide film 51 (FIG. 9B), and a conductor is deposited into the contact holes 52a and 52b to form a source electrode 26, and a lower electrode 2 which also serves as a drain electrode 27 (FIG. 9C). When forming the source electrode 26 and the lower electrode 2, it is preferable that the surface of the deposited conductor be planarized so as to form buried electrodes as shown in FIG. 9C.

Figure 9D:
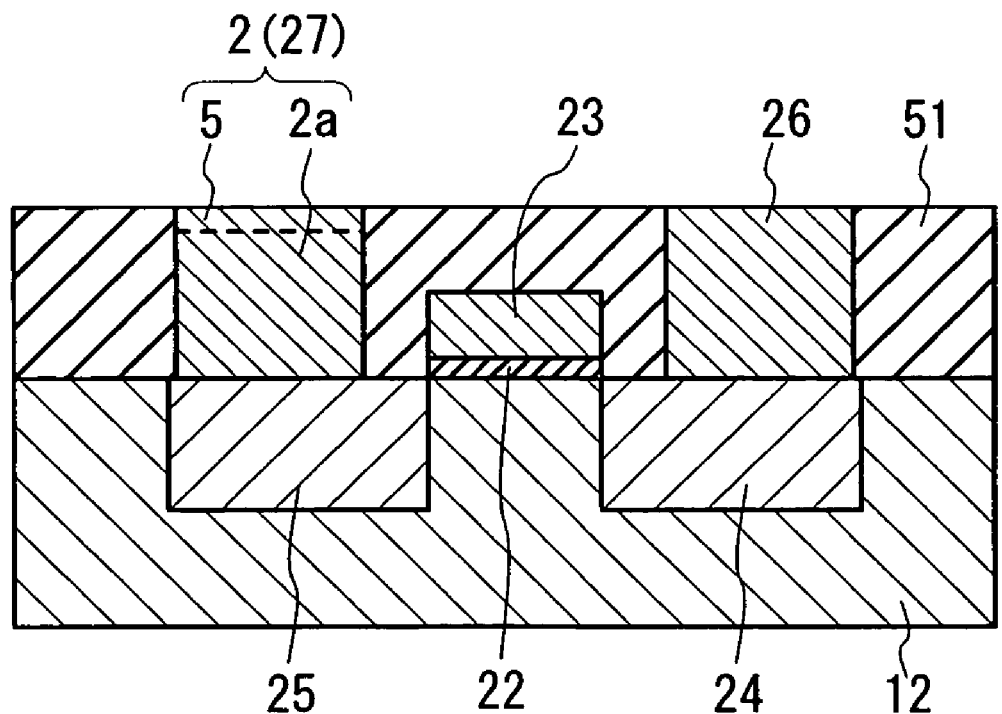
Figure 9E:
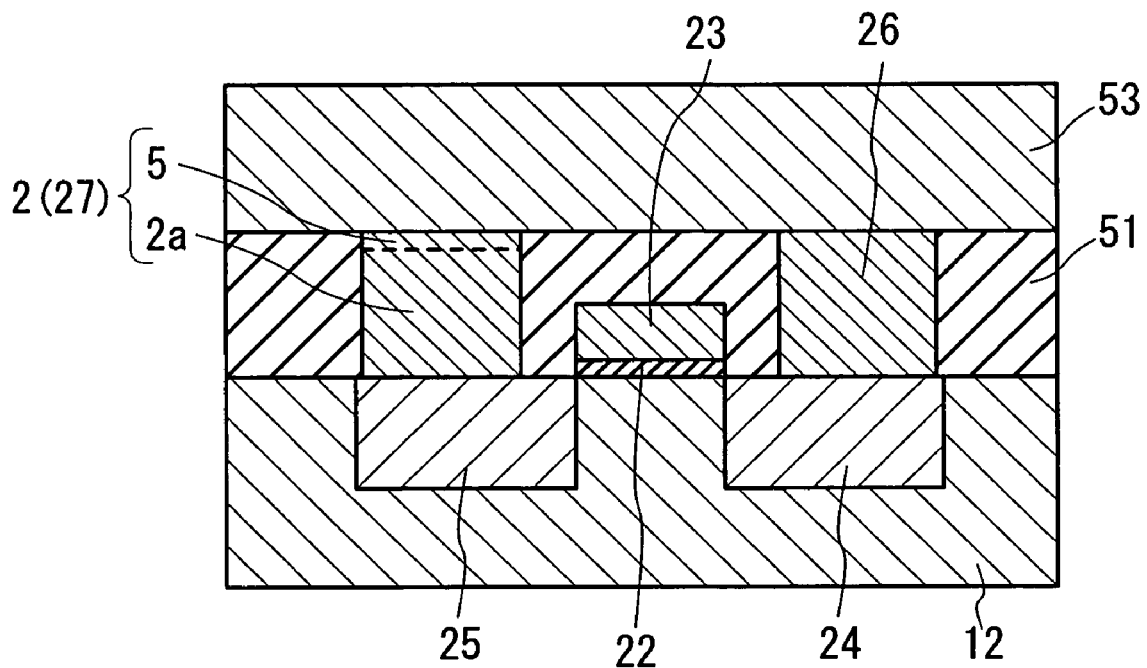

Next, the exposed surface (the surface that is on the opposite side to the substrate 12 side) of the lower electrode 2 that has been formed is subjected to an oxidation process such that not the whole of the lower electrode 2 is oxidized (FIG. 9D). In the example shown in FIG. 9D, a film 5 (oxide film) is formed in the surface that is on the opposite side to the substrate 12 side of the lower electrode 2.

That is, when the lower electrode 2 is formed of metal, that surface is made of a metal oxide as the film 5 while the portion of the lower electrode 2 other than that surface (which is the lower-electrode main portion 2a) is made of the metal. In other words, the lower electrode 2 is formed of the lower-electrode main portion 2a, which is made of metal, and the film 5, which is made of a metal oxide, and the film 5 is formed in the surface of the lower electrode 2. Further, as shown in FIG. 9H and so forth that follow, the film 5 is sandwiched by the lower-electrode main portion 2a and the electro-resistance layer 3. This is not just for the example shown in FIG. 9D but also is the same in the examples shown in FIG. 10D and FIG. 11E, which will be discussed later.

Figure 9F:
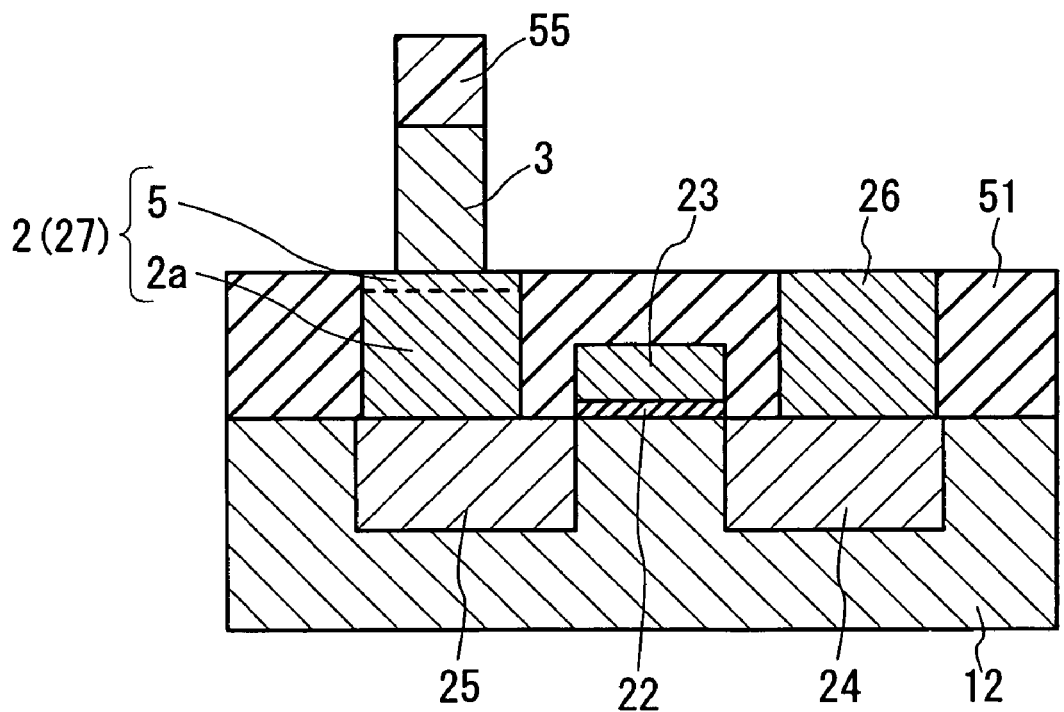
Figure 9G:
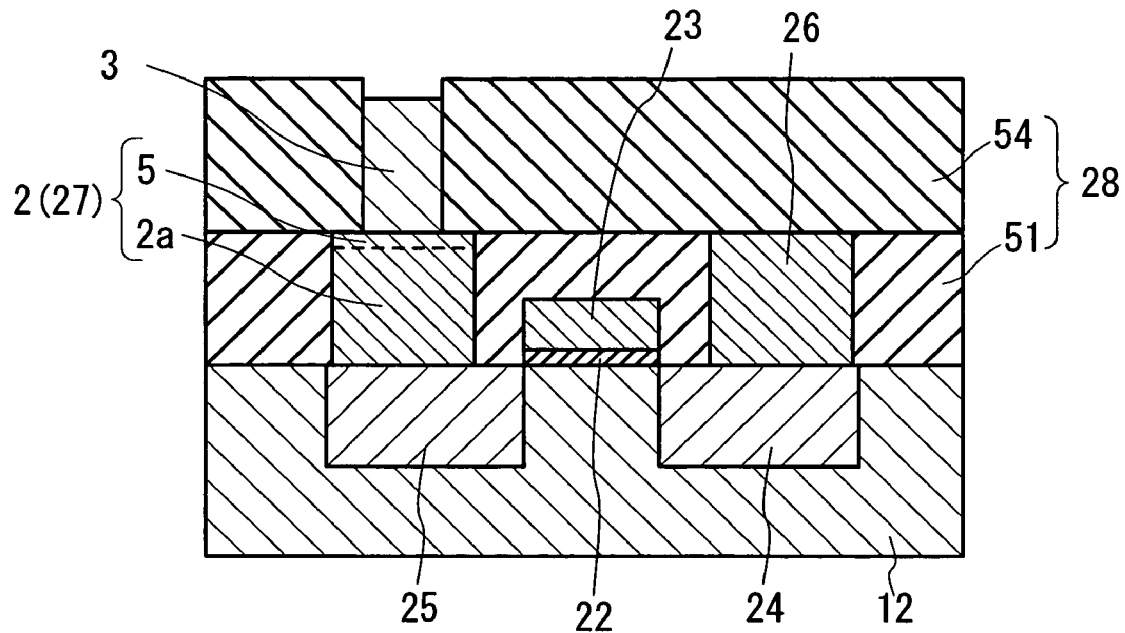
Figure 9H:
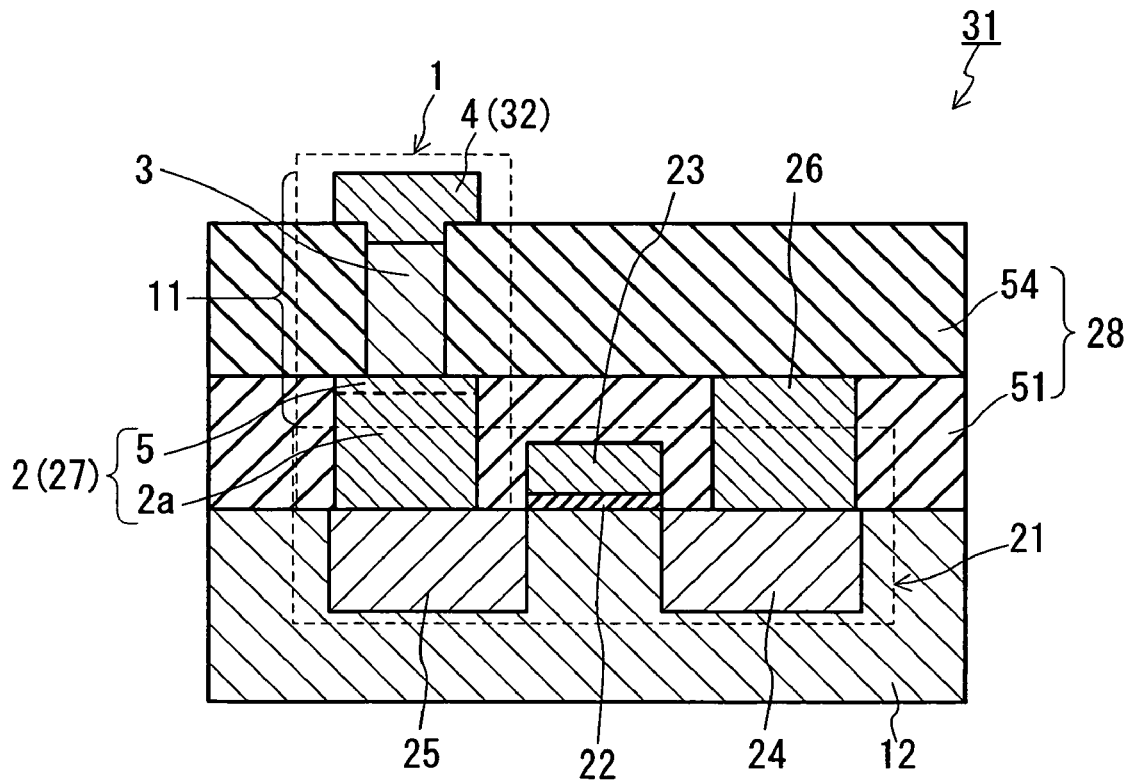

Next, an oxide 53 having a spinel structure is deposited over the entire surface including the lower electrode 2 (FIG. 9E), and thereafter, the oxide 53 is micro-fabricated into a predetermined shape such as a mesa form, to thus form an electro-resistance layer 3 (FIG. 9F). In the example shown in FIG. 9F, since photolithography is used for the micro-fabrication, the resist 55 remains on the formed electro-resistance layer 3. Next, while the resist 55 is left remaining on the electro-resistance layer 3, an insulating layer 54 is deposited over the entire exposed portion of the insulating oxide film 51, the source electrode 26, the lower electrode 2, and the electro-resistance layer 3. Next, the resist 55 is removed by lift-off (FIG. 9G), and an upper electrode 4 is formed at the portion from which the resist has been removed, whereby a memory element 31 is formed in which an electro-resistance element 1 of the present invention is incorporated (FIG. 9H).

Another example of the method of manufacturing the electro-resistance element of the present invention is illustrated in FIGS. 10A to 10H, as one example of the method of manufacturing a memory element similar to the example shown in FIGS. 9A to 9H.

Figure 10A:
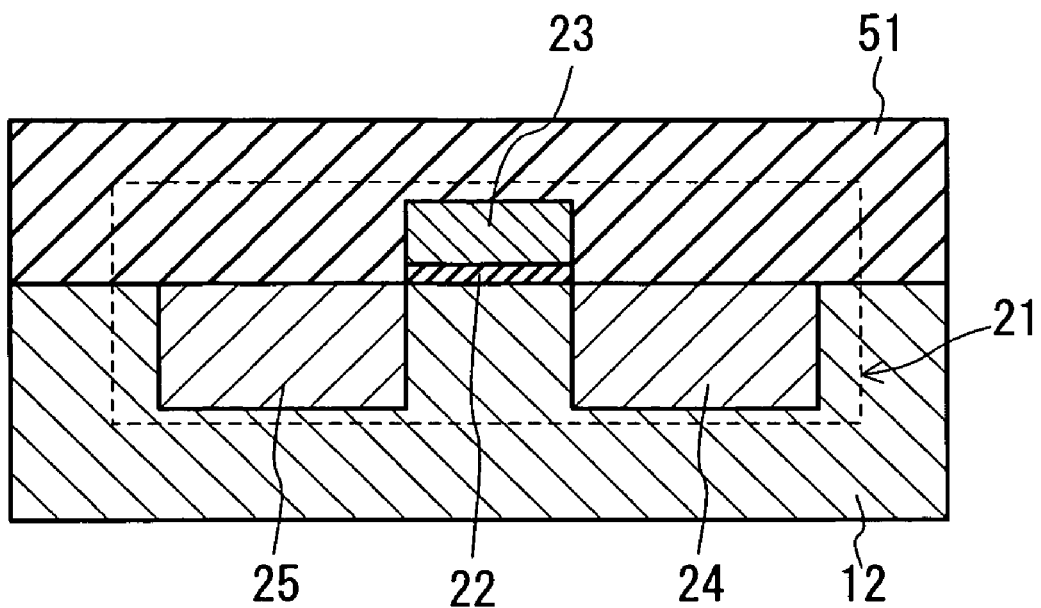
FIGS. 10A to 10H are process drawings schematically illustrating another example of the method of manufacturing an electro-resistance element according to the present invention.
Figure 10B:
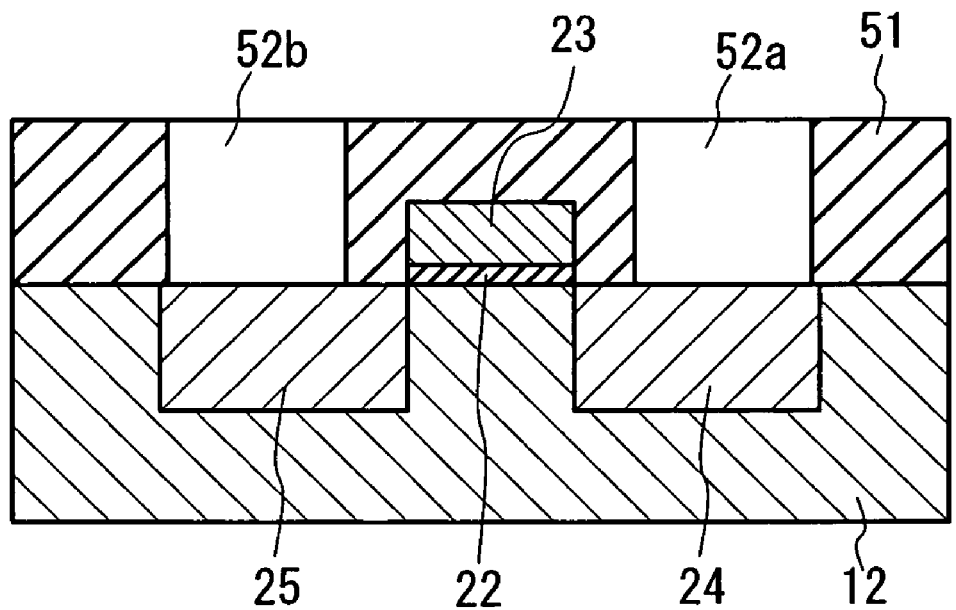

First, a substrate 12 is prepared, on which a transistor 21, a MOS-FET, is formed (FIG. 10A). The substrate 12 shown in FIG. 10A is the same as the substrate 12 shown in FIG. 9A.

Figure 10C:
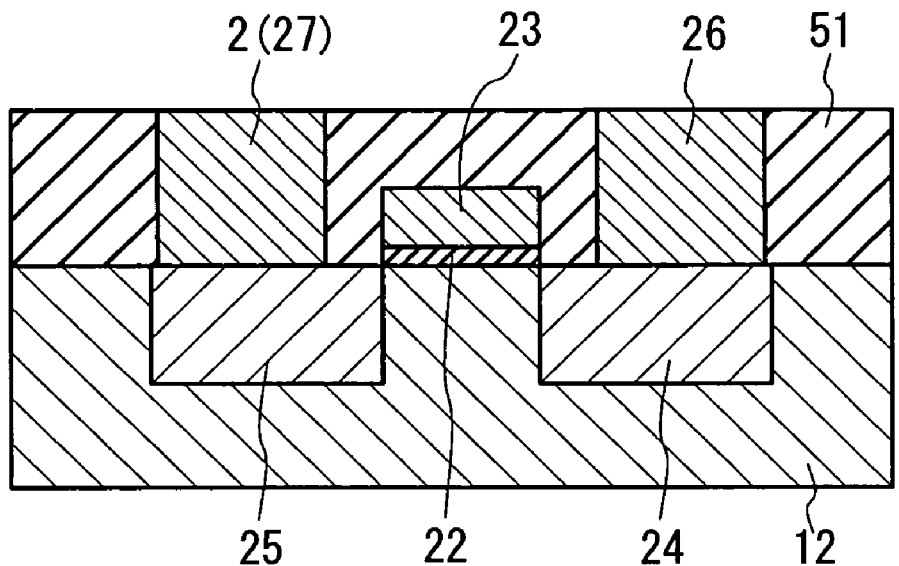

Next, contact holes 52a and 52b that reach the source 24 and the drain 25 in the transistor 21 are formed through an insulating oxide film 51 (FIG. 10B), and a conductor is deposited into the contact holes 52a and 52b to form a source electrode 26 and a lower electrode 2, which also serves as a drain electrode 27 (FIG. 10C).

Figure 10D:
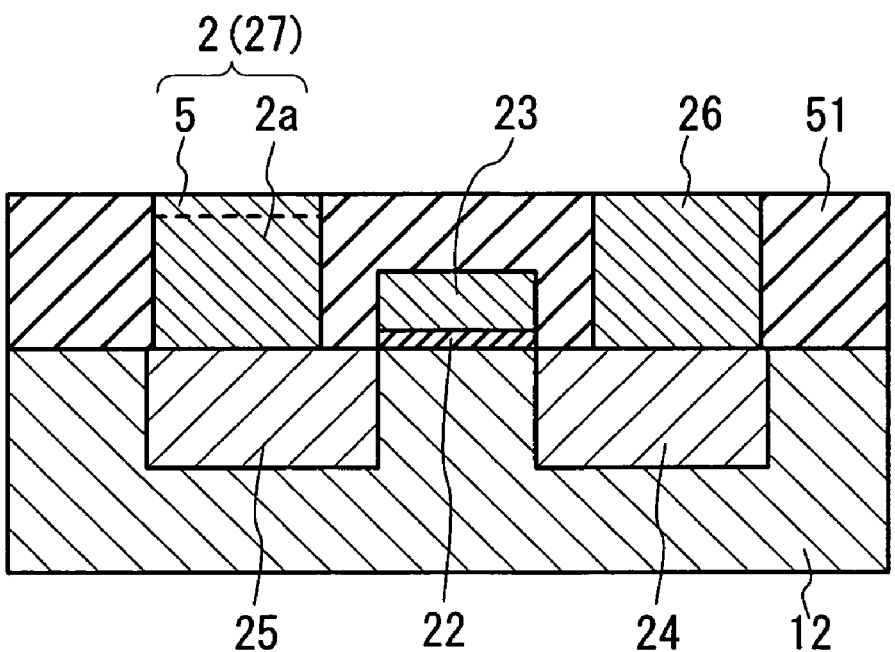
Figure 10E:
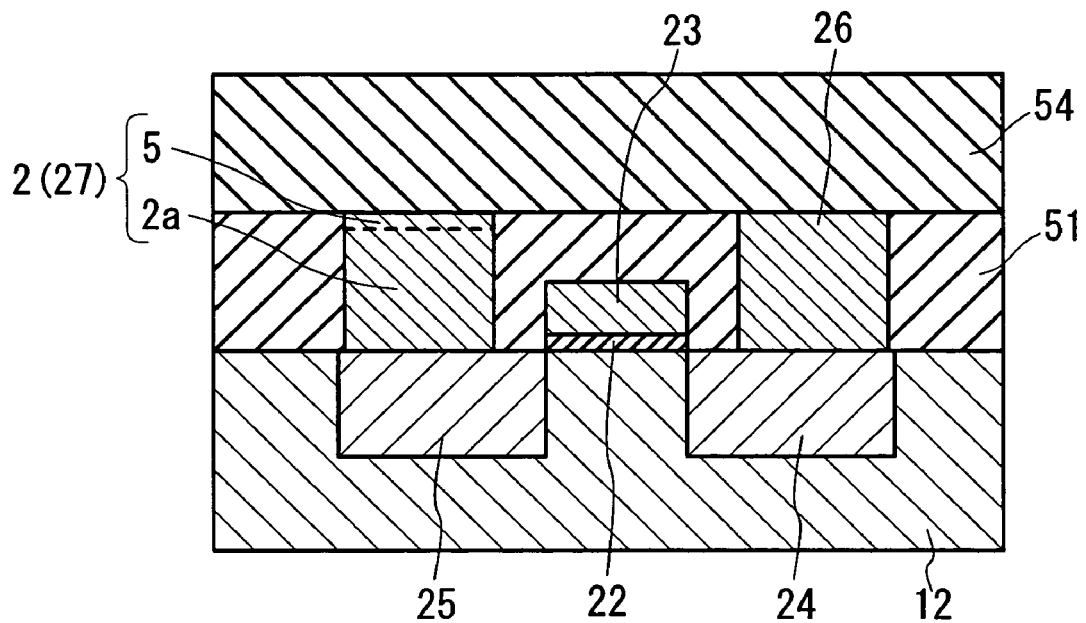

Next, the exposed surface (the surface that is on the opposite side to the substrate 12 side) of the lower electrode 2 that has been formed is subjected to an oxidation process such that not the whole of the lower electrode 2 is oxidized (FIG. 10D). In the example shown in FIG. 10D, a film 5 (oxide film) is formed in the surface that is on the opposite side to the substrate 12 side of the lower electrode 2.

Figure 10F:
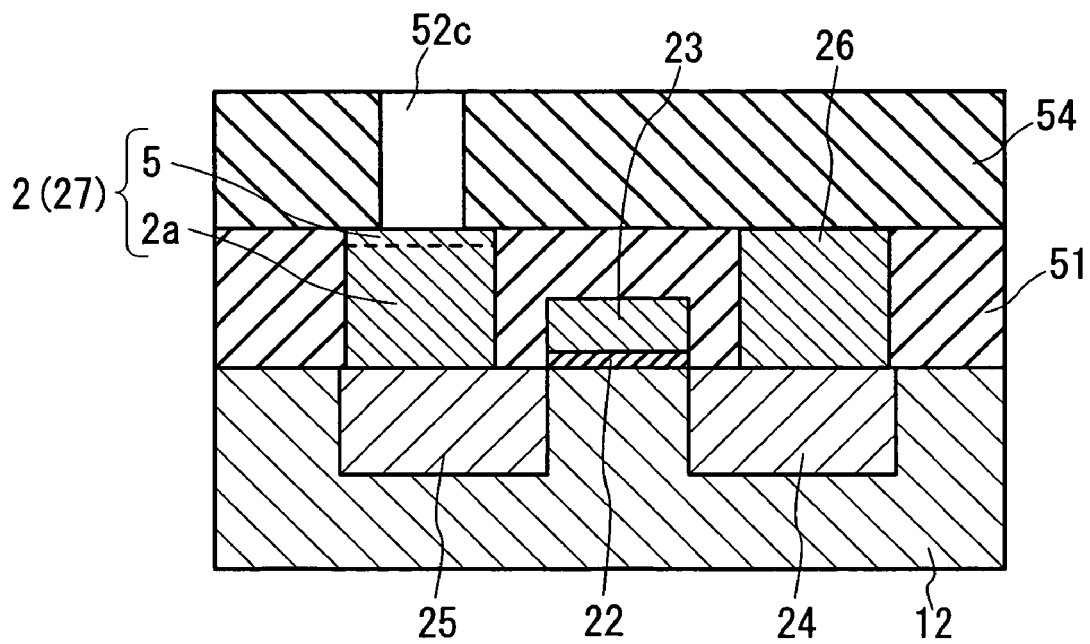
Figure 10G:
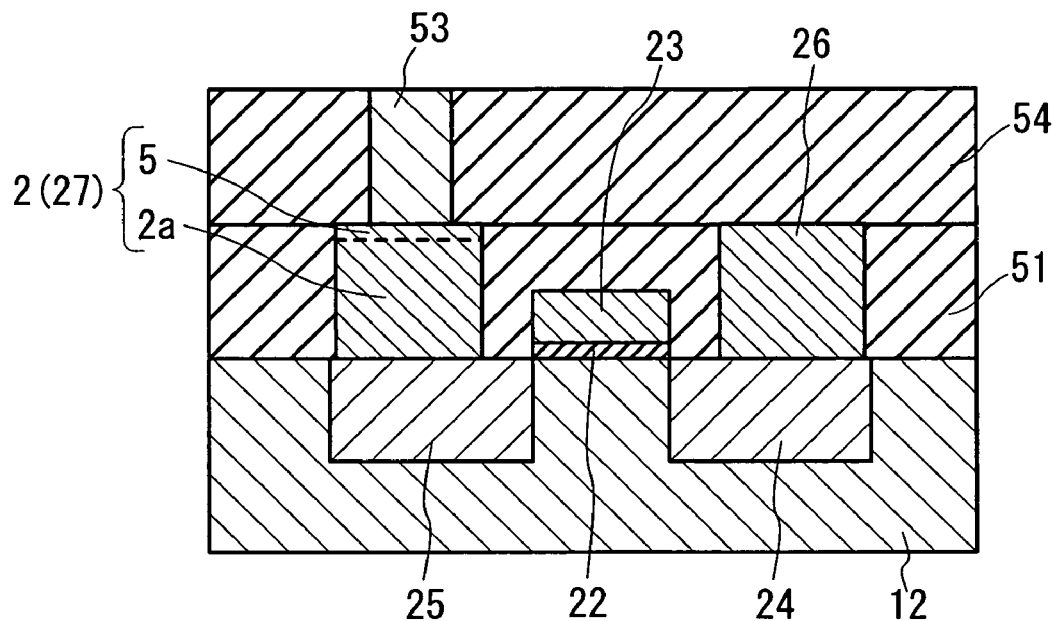
Figure 10H:
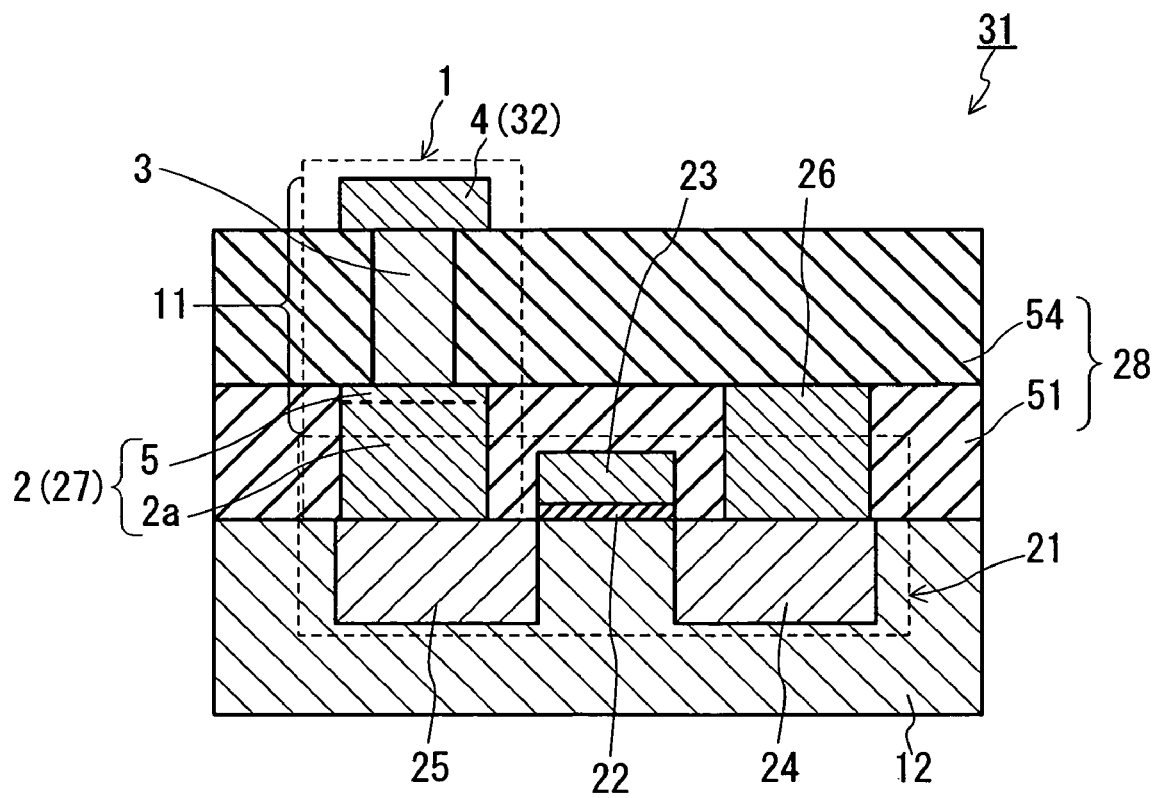

Next, an insulating layer 54 is deposited over the entire exposed portion of the lower electrode 2, the source electrode 26, and the insulating oxide film 51 (FIG. 10E), and a contact hole 52c is formed at a portion of the insulating layer 54 in which an electro-resistance layer 3 is to be disposed (FIG. 10F). Next, an oxide 53 having a spinel structure is disposed into the contact hole 52c, the surface of the deposited oxide is planarized so as to form a electro-resistance layer 3 (FIG. 10G). Finally, an upper electrode 4 is formed on the electro-resistance layer 3, whereby a memory element 31 is formed in which an electro-resistance element 1 of the present invention is incorporated (FIG. 10H).

Still another example of the method of manufacturing the electro-resistance element of the present invention is illustrated in FIGS. 11A to 11J, as one example of the method of manufacturing a memory element similar to the example shown in FIGS. 9A to 9H.

Figure 11A:
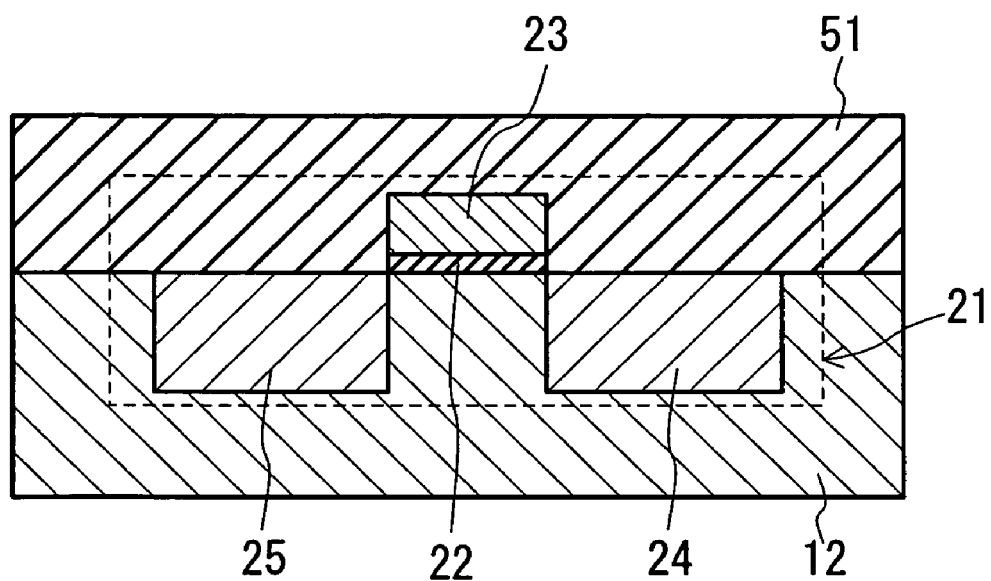
FIGS. 11A to 11J are process drawings schematically illustrating still another example of the method of manufacturing an electro-resistance element according to the present invention.
Figure 11B:
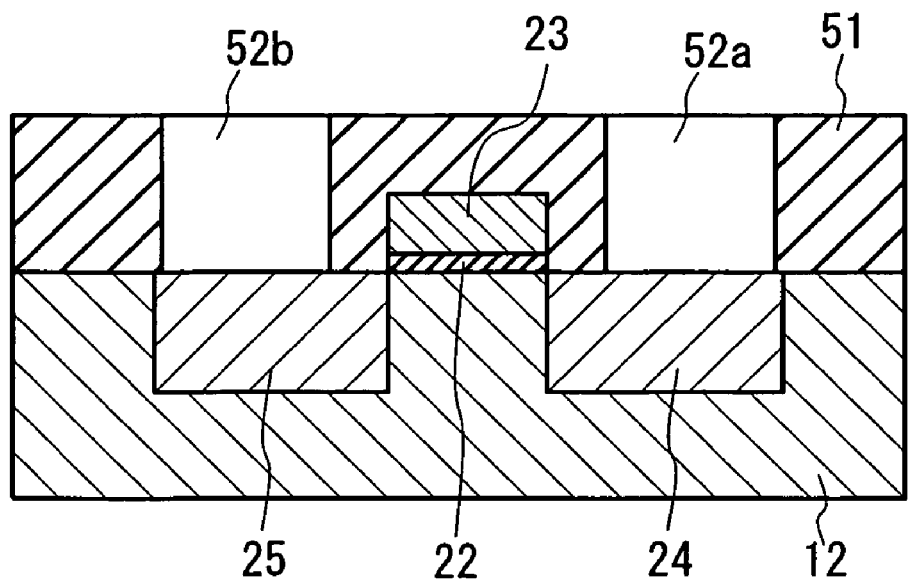

First, a substrate 12 is prepared, on which a transistor 21, a MOS-FET, is formed (FIG. 11A). The substrate 12 shown in FIG. 11A is the same as the substrate 12 shown in FIG. 9A.

Figure 11C:
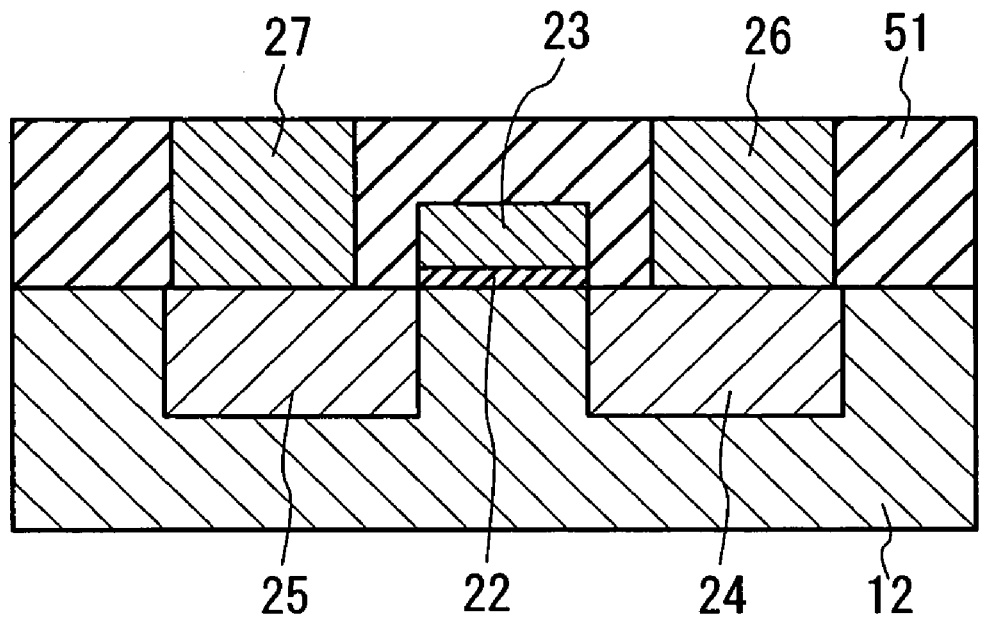
Figure 11D:
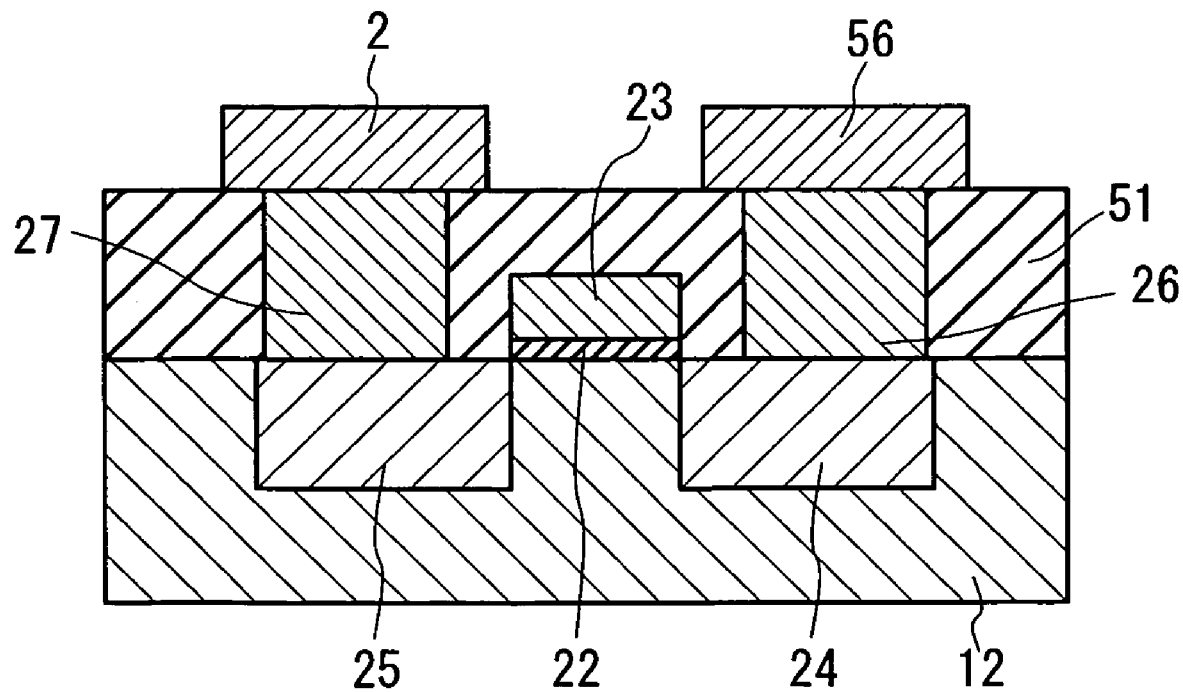

Next, contact holes 52a and 52b that reach the source 24 and the drain 25 in the transistor 21 are formed through an insulating oxide film 51 (FIG. 11B), and a conductor is deposited into the contact holes 52a and 52b to form a source electrode 26 and a drain electrode 27 (FIG. 11C).

Figure 11E:
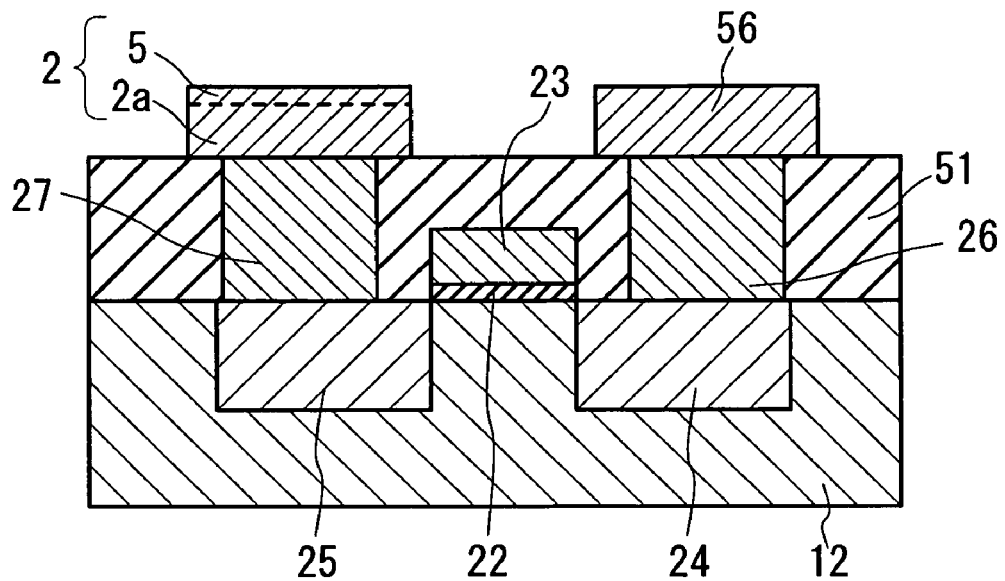
Figure 11F:
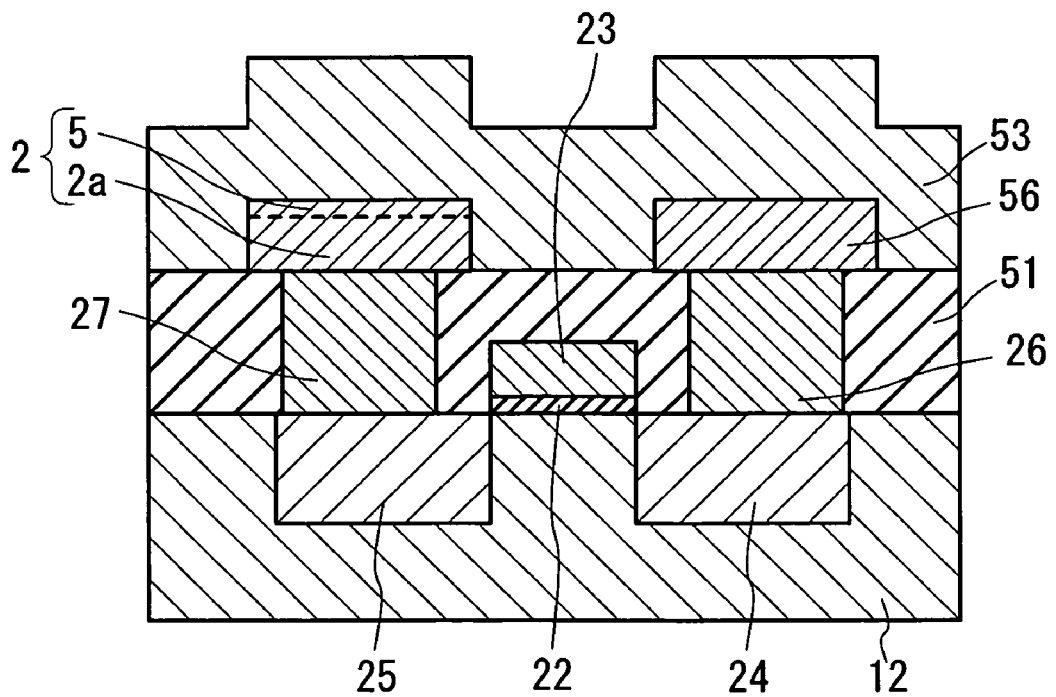

Next, a extracting electrode 56 and a lower electrode 2 are formed respectively over the source electrode 26 and the drain electrode 27 so as to ensure electrical connection with the respective electrodes (FIG. 11D), and the surface of the formed lower electrode 2 that is on the opposite side to the substrate 12 side is subjected to an oxidation process such that not the whole of the lower electrode 2 is oxidized (FIG. 11E). In the example shown in FIG. 11E, a film 5 (oxide film) is formed in the surface of the lower electrode 2 that is on the opposite side of the substrate 12 side.

Figure 11G:
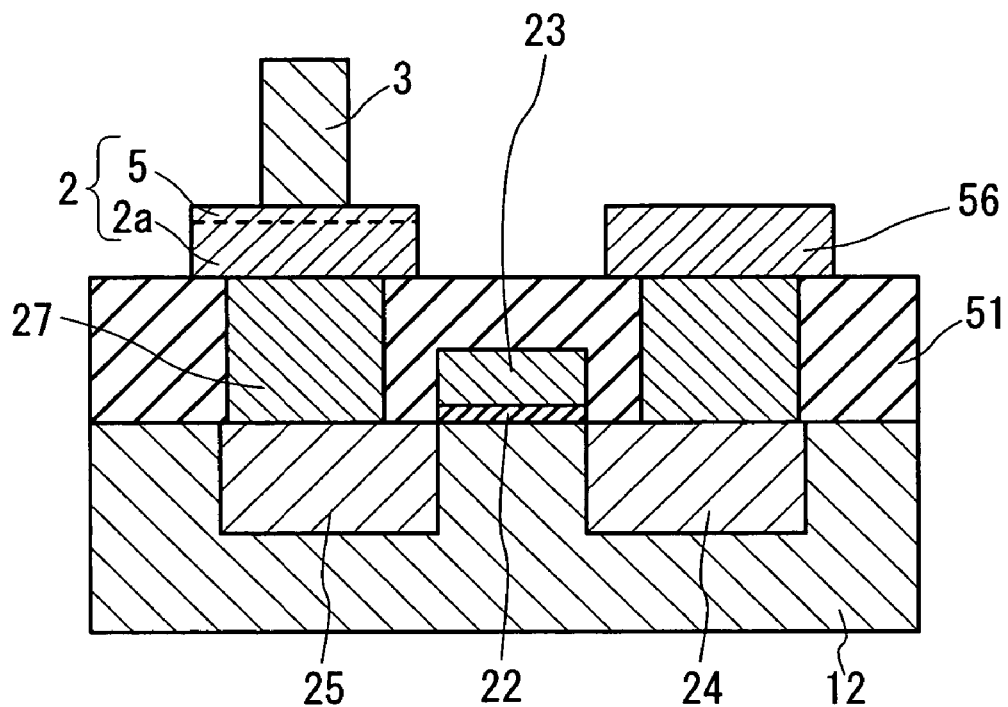
Figure 11H:
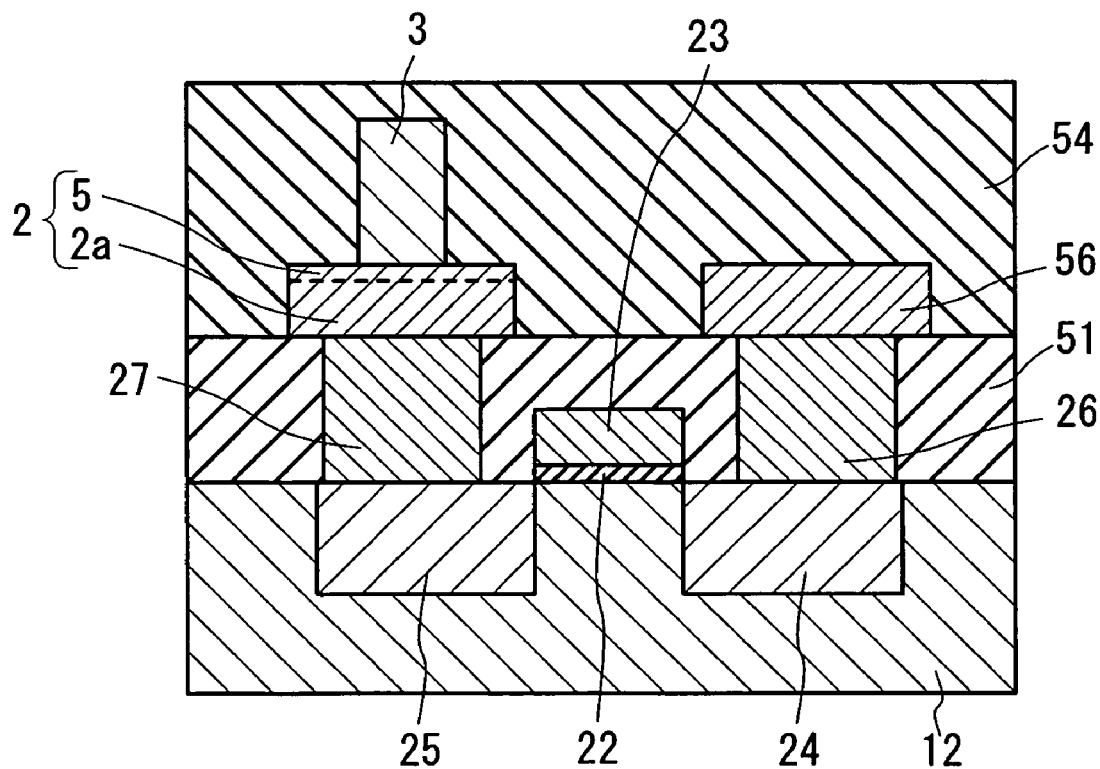

Next, an oxide 53 having a spinel structure is deposited over the entire portion including the lower electrode 2 (FIG. 11F), and thereafter, the oxide 53 is micro-fabricated into a predetermined shape such as a mesa form, to thus form an electro-resistance layer 3 (FIG. 11G).

Figure 11I:
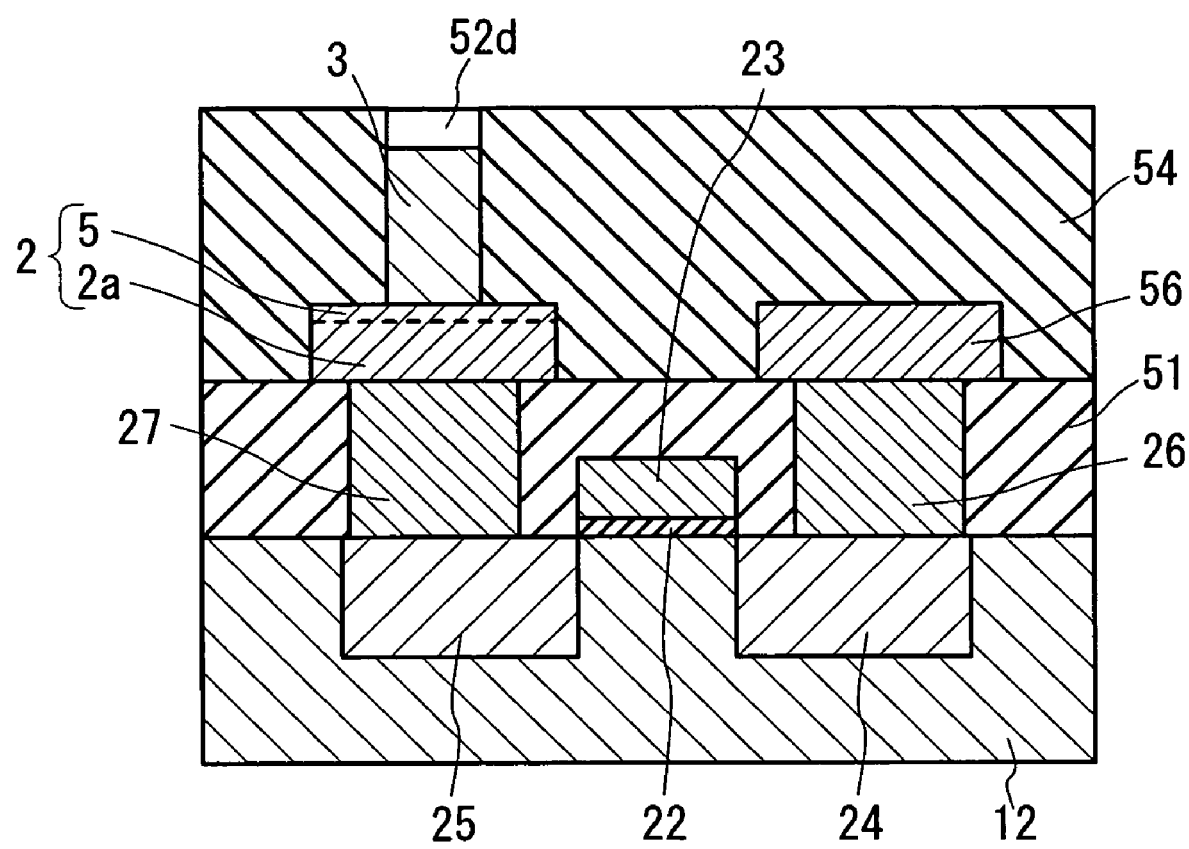
Figure 11J:
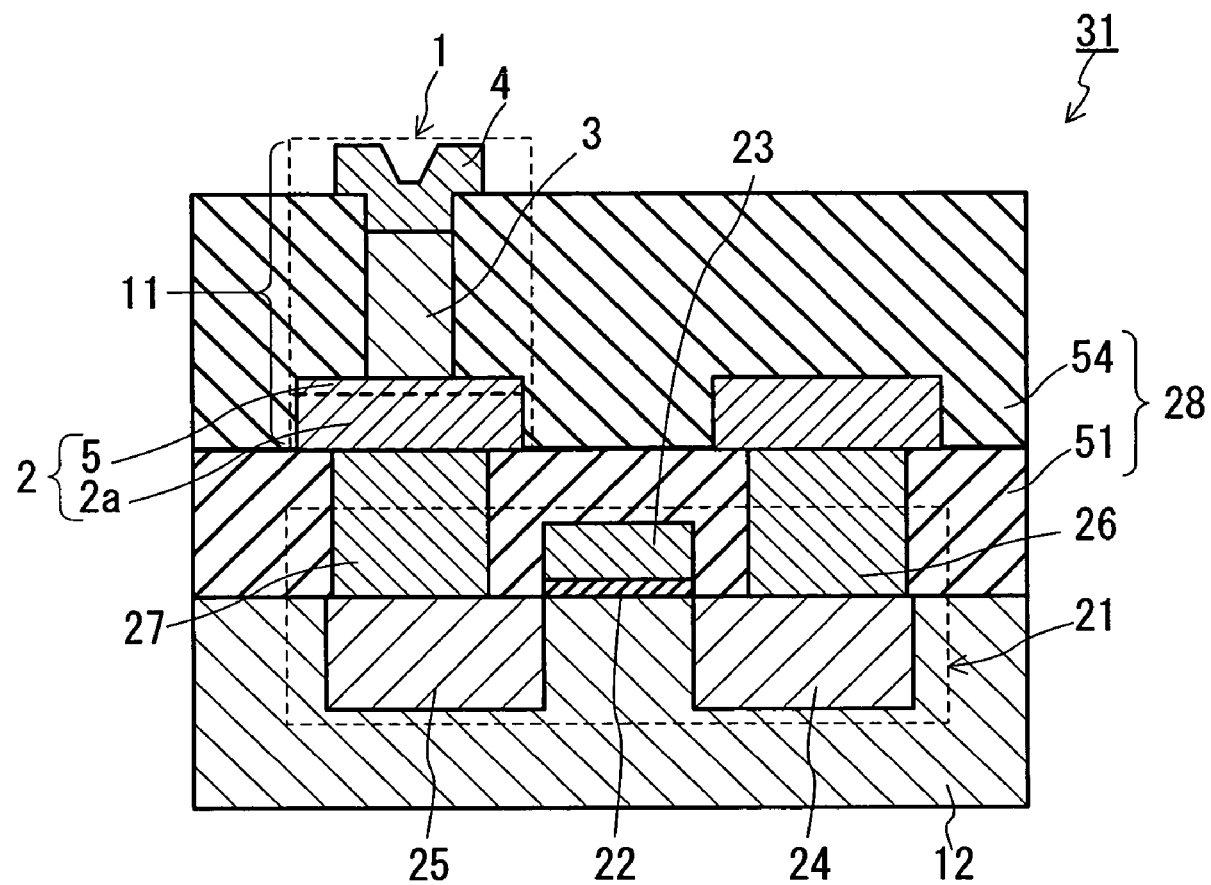

Next, an insulating layer 54 is deposited over the entire exposed portion of the insulating oxide film 51, the extracting electrode 56, the lower electrode 2, and the electro-resistance layer 3 (FIG. 11H), and thereafter, a contact hole 52d is formed in the portion of the insulating layer 54 at which the upper electrode 4 is to be disposed (FIG. 11I). Finally, a conductor is deposited over the formed contact hole 52d to form an upper electrode 4 (FIG. 11J), whereby a memory element 31 is formed in which an electro-resistance element 1 of the present invention is incorporated.

The processes shown in FIGS. 9A to 11J can be realized by applying semiconductor fabrication processes, with the use of common thin-film formation processes and micro-fabrication processes. Examples of the techniques that may be applied to form the layers include pulse laser deposition (PLD), ion beam deposition (IBD), cluster ion beam, and various sputtering techniques such as RF, DC, electron cyclotron resonance (ECR), helicon, inductively coupled plasma (ICP), and facing target sputtering, as well as molecular beam epitaxy (MBE) and ion plating. Other than these PVD (Physical Vapor Deposition) techniques, it is also possible to use CVD (Chemical Vapor Deposition), MOCVD (Metal Organic Chemical Vapor Deposition), a plating method, MOD (Metal Organic Decomposition), or a sol-gel method.

For the micro-fabrication of the layers, the following techniques, which are commonly used in the manufacture processes for semiconductors and magnetic device (for example, magnetoresistive elements such as GMR and TMR), may be used in combination: physical or chemical etching such as ion milling, RIE (Reactive Ion Etching), and FIB (Focused Ion Beam), and photolithography techniques using a stepper for forming micro patterns and an EB (Electron Beam) technique. The planarization of the interlayer insulating layer and the surface of the conductor deposited in the contact holes may be performed by, for example, CMP (Chemical Mechanical Polishing), cluster-ion beam etching, or the like.

The oxidation of the surface of the lower electrode 2 may be performed by, for example, placing the formed lower electrode 2 under an atmosphere containing molecules, ions, plasma, radicals, or the like of oxygen (O) and causing the element that constitutes the lower electrode 2 to react with oxygen. In that case, the condition of oxidation of the lower electrode 2 surface can be controlled by controlling the temperature of the lower electrode 2, the duration for which the lower electrode 2 is placed under that atmosphere, or the like. Specifically, for example, the film deposition of the lower electrode 2 may be conducted by sputtering under an atmosphere of Ar or under an atmosphere of Ar containing $O_2$, and subsequently, Al and O may be caused to react with each other under an atmosphere of $O_2$ or under an atmosphere of $O_2$ containing an inert gas, whereby a lower electrode 2 made of an Al layer the surface of which has been oxidized (made of an Al—$AlO_x$ layer) can be formed. It should be noted that the plasma, radicals, or the like of oxygen can be generated by a common technique such as ECR discharge, glow discharge, RF discharge, helicon, or ICP.

An electronic device provided with the electro-resistance element of the present invention may be realized in a similar manner.

EXAMPLES

Hereinbelow, the present invention is described in further detail with reference to Examples. It should be noted that the present invention is not limited to Examples described below.

In each of Working Examples 1 to 3 and Reference Example 1, an electro-resistance element as shown in FIG. 1 was fabricated and the resistance change characteristics were evaluated.

Working Example 1

Working example 1 utilized an $MFe_2O_4$ (M=Fe: hereinafter "FFO") layer as the electro-resistance layer 3 having a spinel structure.

First, a Si substrate on a surface of which a thermally oxidized film ($SiO_2$ film) was formed was employed as a substrate 12, and a metal mask A having an aperture in a rectangular shape (0.5 mm wide and 10 mm long) was disposed on the Si substrate. Thereafter, an Al layer (400 nm thick) was deposited thereon as a lower electrode 2. After the metal mask A was removed, the size of the deposited Al layer was found to be 0.5 mm×10 mm, which corresponded to the foregoing aperture. The deposition of the Al layer was conducted by magnetron sputtering under an argon atmosphere at a pressure of 0.7 Pa, with setting the temperature of the Si substrate within the range of from 0° C. to 400° C. (mainly at 27° C.) and the applied electric power at 100 W.

Next, the stacked structure of the Si substrate and the Al layer was transferred from the vacuum apparatus in which the stacking of the Al layer was conducted to another vacuum apparatus without exposing the stacked structure to the atmosphere, and was exposed in an oxygen atmosphere at a pressure of 25 kPa for 1 minute, to subject the surface of the Al layer that was on the opposite side to the Si substrate side to an oxidation process. The surface of the Al layer that was oxidized was analyzed along the depth direction by Auger electron spectroscopy, whereby it was confirmed that an oxide film of Al was formed in the foregoing surface, although the boundary between the oxidized portion and the portion that was not oxidized was not very clear.

Auger electron spectroscopy is a technique for analyzing spectrum of Auger electrons obtained through electron-beam irradiation to the surface of a sample, and it can evaluate the type and amount of elements from lithium to uranium through peak energy and peak intensity of the spectrum. Since Auger electron spectroscopy is a technique based on excitation of electrons existing in several atomic layers near the surface, it is desirable as a method for analyzing surface compositions. In the present working example, the foregoing analysis along the depth direction was carried out using the composition analysis by Auger electron spectroscopy additionally, while trimming down the surface of the oxidized Al layer in the direction toward the substrate 12 by sputtering. In the oxidized Al layer, as the amount of the oxidized layer that was trimmed down increased (in other words, as the location went deeper from the surface), the intensity of the signal corresponding to the presence of oxygen reduced.

It should be noted that it is possible to confirm the presence of the oxide film of Al through secondary ion-mass spectrography, Rutherford backscattering spectrometry, or the like, other than Auger electron spectroscopy.

Next, the foregoing stacked structure was transferred again to the previous vacuum apparatus without exposing the structure to the atmosphere, then a metal mask B having an aperture in a square (1 mm×1 mm) shape was disposed on the Al layer the surface of which was oxidized (on the Al—$AlO_x$ layer), and an FFO layer (thickness 200 nm) was deposited as the electro-resistance layer 3. The electro-resistance layer 3 was formed so as to be in contact with the oxide film in the lower electrode 2. After the metal mask B was removed, the size of the deposited FFO layer was found to be 1 mm×1 mm, which corresponded to the foregoing aperture. The metal mask B was disposed so that the center of its aperture (in a rectangular aperture, the point of intersection of two liner lines connecting the opposing vertexes is defined as the center) matched the center of the Al—$AlO_x$ layer on which the metal mask B was disposed. After the deposition, the crystal structure of the FFO layer was confirmed by an X-ray diffraction measurement, and it was found that the FFO layer was in polycrystalline form having a spinel structure.

The deposition of the FFO layer was carried out by magnetron sputtering under an argon atmosphere at a pressure of 0.6 Pa, with setting the temperature of the Si substrate within the range of from 250° C. to 400° C. (mainly at 250° C.) and the applied electric power at 50 W.

Next, the metal mask A was disposed on the deposited FFO layer so that the center of its aperture matched the center of the FFO layer and the longitudinal axis of the aperture was orthogonal to the longitudinal axis of the Al—$AlO_x$ layer, which was the lower electrode 2, and then, a Pt layer (300 nm thick) was deposited as the upper electrode 4. After removing the metal mask A, the size of the deposited Pt layer was found to be 0.5 mm×10 mm, which corresponded to the foregoing aperture. Thus, an electro-resistance element (sample 1-1) was fabricated, in which the longitudinal axis of the lower electrode 2 was orthogonal to the longitudinal axis of the upper electrode 4 and the junction area of the FFO layer was 0.5 mm×0.5 mm. The deposition of the Pt layer was carried out by magnetron sputtering under an argon atmosphere at a pressure of 0.7 Pa, with setting the temperature of the Si substrate within the range of from 0° C. to 400° C. (mainly at 27° C.) and the applied electric power at 100 W.

Apart from the fabrication of the sample 1-1, the following samples were fabricated separately: respective samples in which a Ti layer, a Ru layer, a Ta layer, a Cu layer, a W layer, a Ni layer, and a Ti—Al alloy layer (alloy ratio 6:4) were respectively deposited as the lower electrodes 2 in place of the Al layer and subjected to an oxidation process (samples 1-2 to 1-8); and samples in which the oxidation process step was omitted with the samples 1-1 to 1-6 (reference example samples 1-A to 1-F). In addition, a sample in which a Au layer was deposited as the lower electrode 2 (the oxidation process step was omitted: reference example sample 1-G) was fabricated separately. In the reference example samples in which the oxidation process step was omitted, no oxide film was formed in the surface of the lower electrode 2 that is in contact with the electro-resistance layer 3. The fabrication of each of the samples was conducted basically in the same manner as with the sample 1-1. The crystal structure of the FFO layer in each of the samples was confirmed by an X-ray diffraction measurement, and it was found that all the FFO layers were in polycrystalline form having a spinel structure.

Also, apart from the fabrication of these samples, respective samples in which a Pt layer (the oxidation process step omitted) and a $SrRuO_3$ layer were respectively deposited as the lower electrodes 2 (comparative examples A1 and A2) were fabricated. In the comparative example sample A2, the whole of the lower electrode 2 was formed of an oxide. The fabrication of each of the comparative example samples was basically conducted in the same manner as with the sample 1-1, but because a substrate temperature of 650° C. or higher is required for the deposition of the $SrRuO_3$ layer, the deposition of the $SrRuO_3$ layer in the sample A2 was conducted under an oxygen-argon mixture gas atmosphere (pressure 3 Pa, oxygen partial pressure 20%) by setting the Si substrate temperature at 650° C. and the applied electric power at 100 W.

Each of the samples thus fabricated was evaluated in terms of resistance change rate by applying voltage in a pulse form as shown in FIG. 5. The evaluation of resistance change rate was conducted in the following manner.

Using a pulse generator, a voltage of 5 V (positive bias voltage) as the SET voltage shown in FIG. 5, a voltage of −5V (negative bias voltage, magnitude 5 V) as the RESET voltage, and a voltage of 0.1 V (positive bias voltage) as the READ voltage were randomly applied between the upper electrode and the lower electrode in each of the samples. The pulse width of the voltages was 250 ns. After applying the SET voltage or the RESET voltage, the electric resistance values of the elements were calculated from the current values that were read out through the application of the READ voltage, and the resistance change rate of each of the elements was obtained from the equation $(R_{Max}-R_{Min})/R_{Min} \times 100$ (%), where $R_{Max}$ is the maximum value of the calculated electric resistance values and $R_{Min}$ is the minimum value thereof.

The evaluation results are shown in Table 1 below.

TABLE 1

|  | Sample No. | Lower electrode 2 | Electro-resistance layer 3 | Upper electrode 4 | Resistance change rate (%) |
|---|---|---|---|---|---|
| Working Example | 1-1 | Al—AlO$_x$ | FFO | Pt | 950 |
|  | 1-2 | Ti—TiO$_x$ |  |  | 920 |
|  | 1-3 | Ru—RuO$_x$ |  |  | 930 |
|  | 1-4 | Ta—TaO$_x$ |  |  | 910 |
|  | 1-5 | Cu—CuO$_x$ |  |  | 860 |
|  | 1-6 | W—WO$_x$ |  |  | 890 |
|  | 1-7 | Ni—NiO$_x$ |  |  | 920 |
|  | 1-8 | TiAl—TiAlO$_x$ |  |  | 980 |
| Reference Example | 1-A | Al |  |  | 400 |
|  | 1-B | Ti |  |  | 520 |
|  | 1-C | Ru |  |  | 460 |
|  | 1-D | Ta |  |  | 340 |
|  | 1-E | Cu |  |  | 250 |
|  | 1-F | W |  |  | 260 |
|  | 1-G | Au |  |  | 400 |
| Comparative Example | A1 | Pt |  |  | 30 |
|  | A2 | SrRuO$_3$ |  |  | 20 |

Table 1 shows that the reference example samples 1-A to 1-G and the working example samples 1-1 to 1-8 yielded greater resistance change rates than comparative example samples A1 and A2. In particular, the working example samples, in which the oxidation process step was conducted, yielded high resistance change rates of 860% or greater. Moreover, in the comparative example samples, the resistance change of the elements disappeared by about $10^2$ times of application of the SET voltage and the RESET voltage, while in the working example samples, almost no change was observed in the resistance change rate obtained even after $10^7$ times or more of application of the SET voltage and the RESET voltage.

Thus, the electro-resistance element that has the FFO layer as the electro-resistance layer 3 can be fabricated at a substrate temperature of 400° C. or lower, and therefore, it becomes possible to use Al wiring lines, organic substance-based interlayer insulators, and the like even when the electro-resistance element is jointly incorporated in a semiconductor device such as a system LSI. In addition, since a high-temperature manufacturing process at as high as 650° C. or higher becomes unnecessary, the production is possible at lower cost and the electro-resistance element is excellent in productivity.

With the working example samples, the junction area of the FFO layer was varied in the range of from 0.01 µm² to 10 mm² by varying the aperture areas of the metal masks A and B, and additionally using a photolithography miniaturization technique when fabricating the elements, but almost no variation was observed in the resistance change rates obtained.

Next, an Al layer was deposited on the same Si substrate as that of the sample 1-1 as a lower electrode, and a Cr-doped (Ba, Sr) TiO$_3$ layer (BSTO layer), which is an oxide disclosed in JP 2002-537627A, was deposited on the deposited Al layer. The deposition of the Al layer was conducted in the same manner as with the sample 1-1, and the deposition of the BSTO layer was performed according to the description of JP 2002-537627A. The crystal structure of the deposited BSTO layer was evaluated by X-ray diffraction, and it was found that the crystal phase having a perovskite structure was absent in the BSTO layer. Next, a Pt layer was deposited on the BSTO layer as the upper electrode and the resistance change characteristics of the formed element was evaluated according to the above-noted method, but the element did not show resistance change characteristics at all.

The same result as in the case of depositing the BSTO layer was obtained also in the case where a Cr-doped SrZrO$_3$ layer (SZO layer), which is an oxide described in JP 2002-537627A along with the BSTO layer, was deposited in place of the BSTO layer.

Furthermore, the same results as that in the case of using the Al layer as the lower electrode 2 were obtained when an Au layer, a Ru layer, a Ti layer, an Al layer, a Ta layer, a Cu layer, or a W layer was used as the lower electrode 2 in place of the Al layer, and when the same oxidation process as that for the sample 1-1 was conducted for these layers as the lower electrode 2.

It is believed that the SrRuO$_3$ layer having a perovskite structure, or a Pt layer, that is disclosed in JP 2002-537627A is necessary in order to form a BSTO layer or a SZO layer having a perovskite structure as described in JP 2002-537627A (in other words, in order to form an electro-resistance element employing the BSTO layer or the SZO layer as the electro-resistance layer).

Working Example 2

First, a Si substrate on a surface of which a thermally oxidized film (SiO$_2$ film) was formed was employed as the substrate 12. An Al layer (thickness 400 nm) was deposited on the Si substrate in the same manner as with the sample 1-1, and the surface thereof that is on the opposite side to the Si substrate side was subjected to an oxidation process.

Next, an MFe$_2$O$_4$ (M=Mn$_{0.54}$Zn$_{0.37}$Fe$_{0.01}$: hereinafter MZFFO) layer (thickness 200 nm) was deposited on the Al layer the surface of which is oxidized (Al—AlO$_x$ layer) as the electro-resistance layer 3 having a spinel structure, in the same manner as with the sample 1-1. The deposition of the MZFFO layer was conducted by magnetron sputtering under an argon atmosphere at a pressure of 0.6 Pa, with setting the temperature of the Si substrate within the range of from 250° C. to 400° C. (mainly at 300° C.) and the applied electric power at 40 W. After the deposition, the crystal structure of the MZFFO layer was confirmed by an X-ray diffraction measurement, and it was found that the MZFFO layer was in polycrystalline form having a spinel structure. In addition, the composition of the MZFFO layer was identified by an energy-dispersive X-ray microanalyzer (EDX). It should be noted that the composition is based on atomic fractions.

Next, a Au layer (thickness 300 nm) was deposited as the upper electrode 4 on the deposited MZFFO layer in the same manner as with the sample 1-1. Thus, an electro-resistance element (sample 2-1) was fabricated, in which the longitudinal axis of the lower electrode 2 was orthogonal to the longitudinal axis of the upper electrode 4 and the junction area of the MZFFO layer was 0.5 mm×0.5 mm. The deposition of the Au layer was conducted by magnetron sputtering under an argon atmosphere at a pressure of 0.7 Pa, with setting the temperature of the Si substrate within the range of from 0° C. to 400° C. (mainly at 27° C.) and the applied electric power at 100 W.

Apart from the fabrication of the sample 2-1, the following samples were fabricated: samples in which the layers having respective compositions as set forth in the following Table 2 were deposited as the electro-resistance layers 3 in place of the MZFFO layer (samples 2-2 to 2-4), and samples in which the oxidation process step for the Al layer was omitted in the samples 2-1 to 2-4 (reference example samples 2-A to 2-D). Each of the samples was fabricated basically in the same manner as with the sample 2-1. The crystal structure of the electro-resistance layer in each of the samples was confirmed by an X-ray diffraction measurement, and it was found that all the electro-resistance layers were in polycrystalline form having a spinel structure.

With each of the samples thus fabricated, the resistance change rate was evaluated in the same manner as in Working Example 1. The evaluation results are shown in Table 2 below.

TABLE 2

| Sample No. | Lower electrode 2 | Electro-resistance layer 3 $MFe_2O_4$ | Upper electrode 4 | Resistance change rate (%) |
|---|---|---|---|---|
| Working Example 2-1 | Al—AlO$_x$ | M = Mn$_{0.54}$Zn$_{0.37}$Fe$_{0.01}$ (MZFFO) | Au | 910 |
| 2-2 | | M = Mn | | 860 |
| 2-3 | | M = Mn$_{0.5}$Zn$_{0.5}$ | | 870 |
| 2-4 | | M = Ni | | 850 |
| Reference Example 2-A | Al | M = Mn$_{0.54}$Zn$_{0.37}$Fe$_{0.01}$ (MZFFO) | | 840 |
| 2-B | | M = Mn | | 800 |
| 2-C | | M = Mn$_{0.5}$Zn$_{0.5}$ | | 700 |
| 2-D | | M = Ni | | 730 |

Table 2 demonstrates that all the samples yielded great resistance change rates 700% or greater; in particular, the resistance change rates of the working example samples (850% or greater) tend to be greater than the resistance change rates of the reference examples (700% or greater). Moreover, all the working example samples could be fabricated at a substrate temperature of 400° C. or lower.

Working Example 3

First, a Si substrate on a surface of which a thermally oxidized film (SiO$_2$ film) was formed was employed as the substrate 12. A Ti layer (thickness 400 nm) was deposited on the Si substrate in the same manner as with the sample 1-1, and the surface thereof that is on the opposite side to the Si substrate side was subjected to an oxidation process.

Next, an MZFFO layer (thickness 200 nm) was deposited on the Ti layer the surface of which is oxidized (Ti—TiO$_x$ layer) as the electro-resistance layer 3 having a spinel structure, in the same manner as with the sample 2-1. After the deposition, the crystal structure of the MZFFO layer was confirmed by an X-ray diffraction measurement, and it was found that the MZFFO layer was in polycrystalline form having a spinel structure.

Next, a Pt layer (thickness 300 nm) was deposited as the upper electrode 4 on the deposited MZFFO layer in the same manner as with the sample 1-1. Thus, an electro-resistance element (sample 3-1) was fabricated, in which the longitudinal axis of the lower electrode 2 was orthogonal to the longitudinal axis of the upper electrode 4 and the junction area of the MZFFO layer was 0.5 mm×0.5 mm.

Apart from the fabrication of the sample 3-1, respective samples in which a Ru layer, an Al layer, a Ta layer, a Cu layer, a W layer, and a Ni layer were deposited as the lower electrodes 2 in place of the Ti layer and subjected to an oxidation process (samples 3-2 to 3-7), and samples in which the oxidation process step was omitted in the samples 3-1 to 3-2 and 3-4 to 3-6 (reference example samples 1-A to 1-E) were fabricated. In addition, a sample in which a Au layer was deposited as the lower electrode 2 (the oxidation process step was omitted: reference example 3-F) was fabricated separately. In the reference example samples, in which the oxidation process was omitted, no oxide film was formed on the surface of the lower electrode 2 that is in contact with the electro-resistance layer 3. Each of the samples was fabricated basically in the same manner as with the sample 3-1. The crystal structure of the MZFFO layer in each of the samples was confirmed by an X-ray diffraction measurement, and it was found that all the MZFFO layers were in polycrystalline form having a spinel structure.

In addition, respective samples in which a Pt layer (the oxidation process step omitted) and a SrRuO$_3$ layer were respectively deposited as the lower electrodes 2 (comparative examples B1 and B2) were fabricated. The deposition of each of the layers was conducted in the same manner as with the samples A1 and A2.

With each of the samples thus fabricated, the resistance change rate was evaluated in the same manner as in Working Example 1. The evaluation results are shown in Table 3 below.

TABLE 3

| Sample No. | Lower electrode 2 | Electro-resistance layer 3 | Upper electrode 4 | Resistance change rate (%) |
|---|---|---|---|---|
| Working Example 3-1 | Ti—TiO$_x$ | MZFFO | Pt | 1050 |
| 3-2 | Ru—RuO$_x$ | | | 1520 |
| 3-3 | Al—AlO$_x$ | | | 1600 |
| 3-4 | Ta—TaO$_x$ | | | 1450 |
| 3-5 | Cu—CuO$_x$ | | | 850 |
| 3-6 | W—WO$_x$ | | | 1050 |
| 3-7 | Ni—NiO$_x$ | | | 900 |
| Reference Example 3-A | Ti | | | 800 |
| 3-B | Ru | | | 500 |
| 3-C | Ta | | | 650 |
| 3-D | Cu | | | 450 |
| 3-E | W | | | 500 |
| 3-F | Au | | | 730 |
| Comparative Example B1 | Pt | | | 10 |
| B2 | SrRuO$_3$ | | | 20 |

Table 3 demonstrates that the reference example samples 3-A to 3-F and the working example samples 3-1 to 3-7 yielded greater resistance change rates than the comparative example samples B1 and B2. In particular, the working example samples, in which the oxidation process step was conducted, yielded great resistance change rates of 850% or greater, and as high as 1000% or greater, or 1500% or greater, depending on the configuration of the lower electrode 2. Moreover, in the comparative example samples, the resistance change in the elements disappeared at about $10^2$ times of application of the SET voltage and the RESET voltage, while in the working example samples, almost no change in the resistance change rates was observed even with $10^7$ times or more of application of SET voltage and the RESET voltage.

Furthermore, all the working example samples could be fabricated at a substrate temperature of 400° C. or lower.

Reference Example 1

First, a Si substrate on a surface of which a thermally oxidized film (SiO$_2$ film) was formed was employed as the substrate 12. An Al layer (thickness 400 nm) was deposited on the Si substrate in the same manner as with the sample 1-1.

Next, without performing the oxidation of the Al layer, a CoFe$_2$O$_4$ layer (hereinafter CFO layer: thickness 200 nm) was deposited on the deposited Al layer as the electro-resistance layer 3 having a spinel structure. The deposition of the CFO layer was conducted by magnetron sputtering under an argon atmosphere at a pressure of 0.6 Pa, with setting the temperature of the Si substrate within the range of from 250° C. to 400° C. (mainly at 350° C.) and the applied electric power at 100 W. After the deposition, the crystal structure of the CFO layer was confirmed by an X-ray diffraction measurement, and it was found that the CFO layer was in polycrystalline form having a spinel structure.

Next, a Ag layer (thickness 300 nm) was deposited as the upper electrode 4 on the deposited CFO layer in the same manner as with the sample 1-1. Thus, an electro-resistance element was fabricated, in which the longitudinal axis of the lower electrode 2 was orthogonal to the longitudinal axis of the upper electrode 4 and the junction area of the CFO layer was 0.5 mm×0.5 mm. The deposition of the Ag layer was conducted by magnetron sputtering under an argon atmosphere at a pressure of 0.7 Pa, with setting the temperature of the Si substrate within the range of from 0° C. to 400° C. (mainly at 27° C.) and the applied electric power at 100 W.

With the element thus fabricated, the resistance change rate was evaluated in the same manner as in Working Example 1, and it was found that the resistance change rate was 180%.

Next, an electro-resistance element in which the previously-described MZFFO layer was deposited in place of the CFO layer was fabricated in the same manner. With the fabricated element, the resistance change rate was evaluated in the same manner as in Working Example 1, and it was found that the resistance change rate was 250%.

As has been discussed above, the electro-resistance element according to the present invention has good resistance change characteristics. Moreover, the electro-resistance element according to the present invention can be fabricated by a manufacture process at 400° C. or lower; therefore, various semiconductor manufacture processes may be easily applied when manufacturing the element, and the element can be applied to various electronic devices by, for example, combining it with a semiconductor element. Furthermore, the electro-resistance element of the present invention can retain information as an electric resistance value in a non-volatile manner, and miniaturization of the element is easier than conventional charge storage type memory elements. Examples of the electronic devices using the electro-resistance element of the present invention include non-volatile memories, switching elements, sensors, and image display devices, which may be used for information communication terminals.

The invention may be embodied in other forms without departing from the spirit or essential characteristics thereof The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. An electro-resistance element having two or more states in which electric resistance values are different, and being switchable from one of the two or more states into another by application of a predetermined voltage or current, the electro-resistance element comprising:
   a multilayer structure including an upper electrode, a lower electrode, and an electro-resistance layer sandwiched by the electrodes, the multilayer structure disposed on a substrate; wherein
   the electro-resistance layer has a spinel structure, and
   a surface of the lower electrode that faces the electro-resistance layer is oxidized,
   wherein the resistance change rate is 400% or greater.

2. The electro-resistance element according to claim 1, wherein an oxide film of the element that constitutes the lower electrode is formed in the surface of the lower electrode.

3. The electro-resistance element according to claim 1, wherein the lower electrode contains at least one element selected from the group consisting of Ru, Ti, Al, Ta, Cu, W and Ni.

4. The electro-resistance element according to claim 1, wherein the electro-resistance layer contains an oxide having a composition represented by the formula MM'$_2$O$_4$, where M and M' are at least one element selected from the group consisting of Mn, Fe, Co, Ni, Cu, and Zn, and may be either different from each other or the same.

5. The electro-resistance element according to claim 4, wherein M' is Fe.

6. The electro-resistance element according to claim 1, wherein the resistance change rate is 850% or greater.

7. The electro-resistance element according to claim 1, wherein the predetermined voltage or current is in a pulse form.

8. A method of manufacturing an electro-resistance element according to claim 1, comprising:
   forming a lower electrode on a substrate;
   oxidizing a surface of the formed lower electrode; and
   forming, on the oxidized lower electrode, an electro-resistance layer having a spinel structure and an upper electrode in that order.

9. The method according to claim 8, wherein the forming of the lower electrode and the forming of the electro-resistance layer and the upper electrode are performed while the temperature of the substrate is set at 400° C. or lower.

* * * * *